US010910950B2

(12) United States Patent
Kihara et al.

(10) Patent No.: US 10,910,950 B2
(45) Date of Patent: Feb. 2, 2021

(54) POWER CONVERSION DEVICE

(71) Applicant: Mitsubishi Electric Corporation, Tokyo (JP)

(72) Inventors: Nobuhiro Kihara, Tokyo (JP); Yuta Komatsu, Tokyo (JP); Takashi Kaneyama, Tokyo (JP); Masaki Sawamura, Tokyo (JP); Noriyuki Wada, Tokyo (JP); Yuya Tanaka, Tokyo (JP)

(73) Assignee: Mitsubishi Electric Corporation, Tokyo (JP)

( * ) Notice: Subject to any disclaimer, the term of this patent is extended or adjusted under 35 U.S.C. 154(b) by 0 days.

(21) Appl. No.: 16/608,947

(22) PCT Filed: May 8, 2017

(86) PCT No.: PCT/JP2017/017333
§ 371 (c)(1),
(2) Date: Oct. 28, 2019

(87) PCT Pub. No.: WO2018/207224
PCT Pub. Date: Nov. 15, 2018

(65) Prior Publication Data
US 2020/0195146 A1 Jun. 18, 2020

(51) Int. Cl.
H02M 3/158 (2006.01)
G01R 19/165 (2006.01)
(Continued)

(52) U.S. Cl.
CPC .... H02M 3/1584 (2013.01); G01R 19/16528 (2013.01); G05F 1/565 (2013.01);
(Continued)

(58) Field of Classification Search
CPC .. H02M 3/158; H02M 3/1584; H02M 3/1586; H02M 1/32; H02M 2001/0009;
(Continued)

(56) References Cited

U.S. PATENT DOCUMENTS 9,893,619 B2 * 2/2018 Kihara ............... H02M 1/36
2008/0218176 A1 * 9/2008 Ohashi ............... G01R 31/40
324/548

(Continued)

FOREIGN PATENT DOCUMENTS

JP 2013-074724 A 4/2013
JP 5457559 B2 4/2014

OTHER PUBLICATIONS

International Search Report of PCT/JP2017/017333 dated Jul. 4, 2017.

Primary Examiner — Matthew V Nguyen
(74) Attorney, Agent, or Firm — Sughrue Mion, PLLC; Richard C. Turner

(57) ABSTRACT

A power conversion device including an intermediate capacitor that carries out a charging and discharging operation and a voltage sensor that detects a voltage of the intermediate capacitor, and including a current sensor that detects a current flowing in a reactor, and an abnormality determining unit that determines that there is an abnormality of the voltage sensor using a current value calculated based on a detected value from the current sensor, wherein a gain error, an offset error, and a sticking error of the voltage sensor can be detected.

12 Claims, 18 Drawing Sheets

(51) Int. Cl.
  *G05F 1/565* (2006.01)
  *G05F 1/595* (2006.01)
  *H02M 1/32* (2007.01)
  *H02M 1/00* (2006.01)

(52) U.S. Cl.
  CPC .............. *G05F 1/595* (2013.01); *H02M 1/32* (2013.01); *H02M 2001/0009* (2013.01)

(58) Field of Classification Search
  CPC .......... G05F 1/565; G05F 1/569; G05F 1/595; G01R 19/16504; G01R 19/16528
  See application file for complete search history.

(56) References Cited

U.S. PATENT DOCUMENTS

| | | |
|---|---|---|
| 2013/0119961 A1 | 5/2013 | Okuda et al. |
| 2017/0271989 A1* | 9/2017 | Ikeda ...................... H02M 1/14 |
| 2018/0145601 A1* | 5/2018 | Komatsu ........... H02M 3/33584 |

* cited by examiner

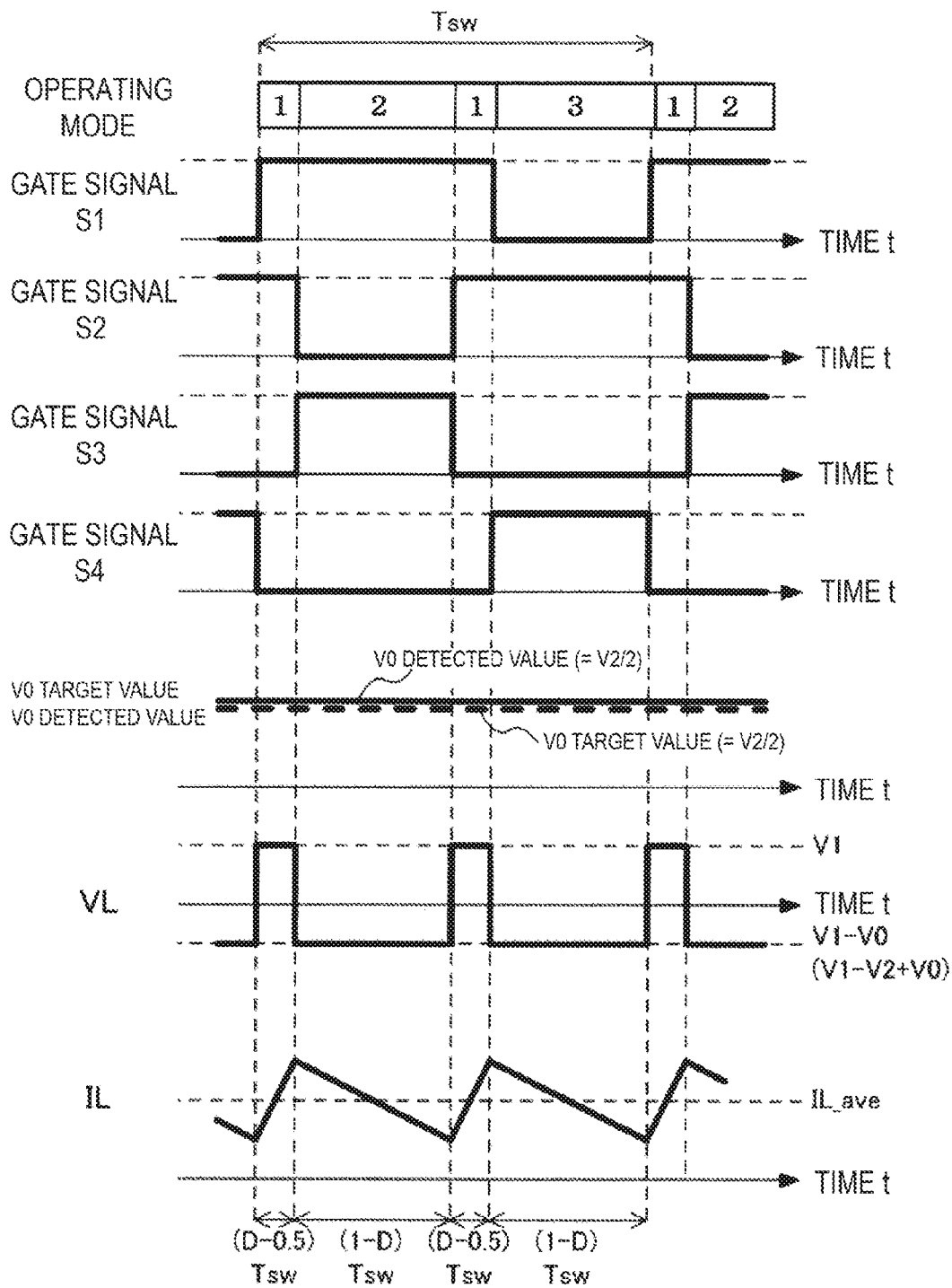

POWER CONVERSION DEVICE

CROSS REFERENCE TO RELATED APPLICATIONS

This application is a National Stage of International Application No. PCT/JP2017/017333 filed May 8, 2017.

TECHNICAL FIELD

The present invention relates to a power conversion device that carries out DC-DC power conversion.

BACKGROUND ART

An existing DC-DC power conversion device is configured so that voltage of a direct current power supply is converted into a predetermined voltage by being stepped up or stepped down by controlling an amount of energy accumulated in or discharged from a reactor, utilizing an on-off operation of a semiconductor switch, and the converted voltage is output to a load device such as a motor. Furthermore, utilization of a charging and discharging of a capacitor is carried out in order to reduce voltage applied to the reactor.

Also, using a semiconductor module in which first to fourth semiconductor switching circuits are connected in series, charging and discharging is carried out by connecting one end of a capacitor for charging and discharging (an intermediate capacitor) to a connection point of the first semiconductor switching circuit and the second semiconductor switching circuit, connecting another end to a connection point of the third semiconductor switching circuit and the fourth semiconductor switching circuit, and controlling the first to fourth semiconductor switching circuits. Furthermore, in order that an overvoltage is not applied to the first to fourth semiconductor switching circuits, a value of voltage accumulated in the intermediate capacitor, which carries out a charging or discharging in accordance with an on-off operation of a semiconductor switching circuit, is detected by a voltage sensor, and a control of charging so that stepping up is not carried out to or above a reference step-up voltage value, or a control of discharging so that stepping down is not carried out to or below a reference step-down voltage value, is carried out (Patent Document 1).

Furthermore, envisaging an occurrence of an abnormal state wherein a voltage value of a power conversion unit intermediate capacitor cannot be detected normally due to an abnormality of a voltage sensor, or the like, there is a proposal for measuring a time from a start of charging and a value of accumulated voltage, and stopping power conversion control on the assumption that voltage accumulated in the intermediate capacitor is insufficient when the value of voltage accumulated after a predetermined time elapses does not rise to or above a set voltage value (Patent Document 2).

CITATION LIST

Patent Literature

Patent Document 1: Japanese Patent No. 5,457,559
Patent Document 2: JP-A-2013-074724

SUMMARY OF INVENTION

Technical Problem

However, a power conversion device described in Patent Document 2 has a timer that measures time from a point at which charging of an intermediate capacitor can be carried out, and it is determined that there is an abnormality in a voltage sensor that detects intermediate capacitor voltage when the intermediate capacitor voltage does not rise to or above a value at which voltage detection starts, even though a measuring time equal to or greater than a determination time has elapsed. Because of this, there is a problem in that an abnormality of the voltage sensor cannot be detected when a gain error, which is an abnormality such that a value detected by the voltage sensor has a gain other than 1 with respect to a true value, occurs in the voltage sensor, or when an offset error, which is an abnormality such that a value detected by the voltage sensor is offset with respect to a true value, occurs. A reason for this is that the kind of power conversion device described in Patent Document 1 is such that, generally, feedback control is carried out so that a detected value of intermediate capacitor voltage and a target value coincide, because of which the detected value of intermediate capacitor voltage and the target value coincide. Furthermore, an abnormality of the voltage sensor cannot be detected even when there is an occurrence of a sticking error, which is an abnormality such that a value detected by the voltage sensor becomes stuck in a region at or above a value at which voltage detection starts.

The invention, having been contrived in order to resolve the previously described problem, has an object of obtaining a power conversion device such that a gain error, an offset error, and a sticking error of a voltage sensor that detects an intermediate capacitor voltage can be detected.

Solution to Problem

The invention is a power conversion device including a switching circuit, a capacitor that carries out a charging and discharging operation in accordance with a switching of the switching circuit, and a voltage sensor that detects a voltage across the capacitor, and is characterized in that a current sensor that detects a current supplied to a circuit including the capacitor, and abnormality determining means that determines that there is an abnormality of the voltage sensor based on a value of current detected by the current sensor and a charging and discharging operation of the capacitor, are provided.

Advantageous Effects of Invention

According to the power conversion device of the invention, a gain error, an offset error, and a sticking error of a voltage sensor can be detected.

BRIEF DESCRIPTION OF DRAWINGS

FIG. 4 is a timing diagram for describing a circuit operation of the first embodiment of the invention when the step-up ratio N is 2 times or greater, and when in a powering state.

DESCRIPTION OF EMBODIMENTS

First Embodiment

Hereafter, a first embodiment of the invention will be described.

Figure 1:
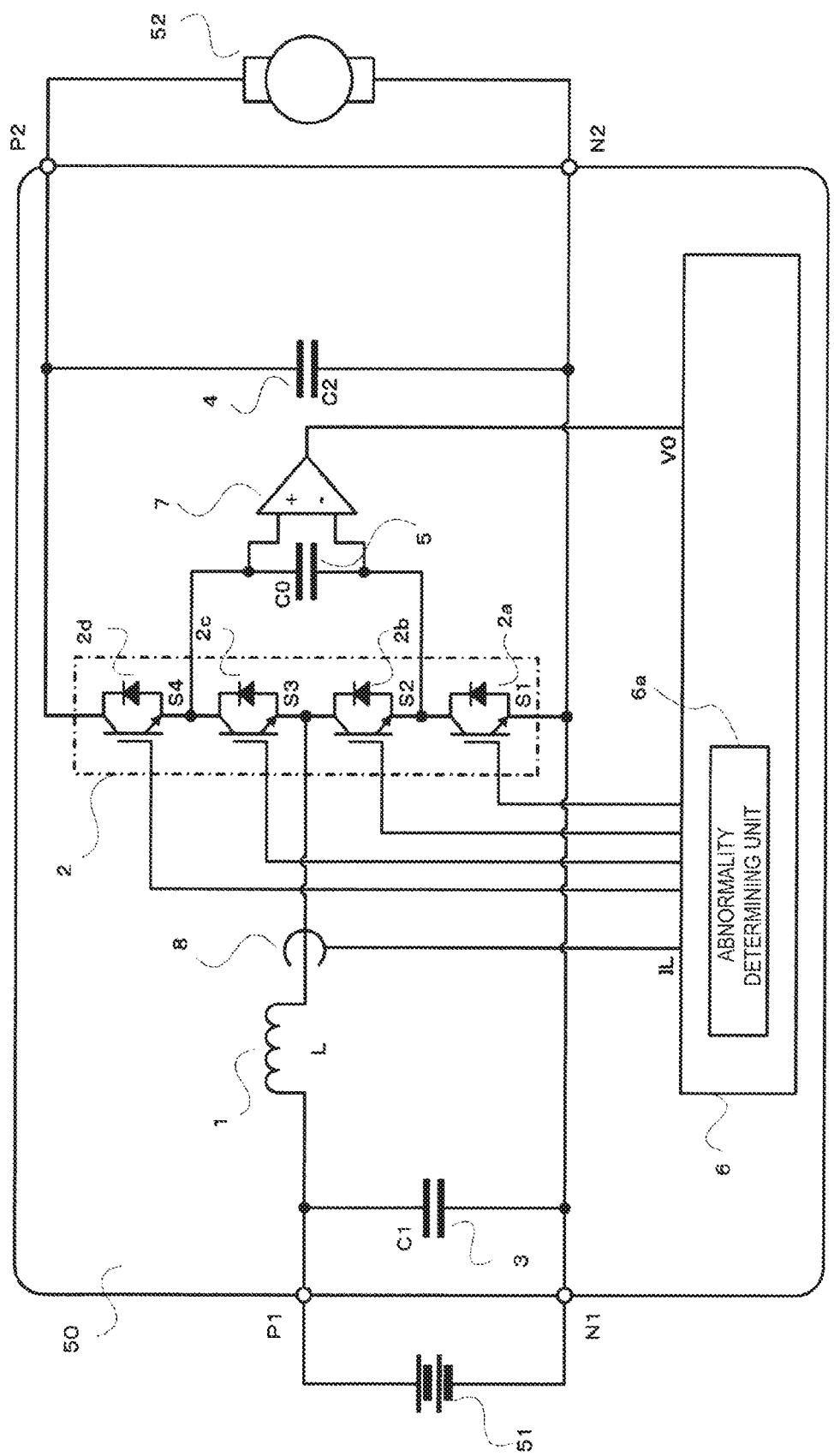
FIG. 1 is a power conversion device circuit diagram for describing a first embodiment of the invention.

FIG. 1 is a power conversion device circuit diagram for describing the first embodiment of the invention.

As shown in FIG. 1, a power conversion device 50 is configured of a reactor 1, a semiconductor module 2 formed of a first semiconductor switching circuit 2a, a second semiconductor switching circuit 2b, a third semiconductor switching circuit 2c, and a fourth semiconductor switching circuit 2d, a low voltage side capacitor 3, a high voltage side capacitor 4, an intermediate capacitor 5, control means 6 that controls the first semiconductor switching circuit 2a, the second semiconductor switching circuit 2b, the third semiconductor switching circuit 2c, and the fourth semiconductor switching circuit 2d, a voltage sensor 7 that detects an end-to-end voltage V0 (a V0 true value) of the intermediate capacitor, and a current sensor 8 that detects a current flowing through the reactor 1.

The control means 6 includes an abnormality determining unit 6a that determines that there is an abnormality of the voltage sensor 7 using a current value calculated based on a value detected by the current sensor 8.

Also, a high voltage battery 51 is connected to a low voltage side (between P1 and N1) of the power conversion device 50, and a motor 52 is connected to a high voltage side (between P2 and N2). Each of the first to fourth semiconductor switching circuits 2a to 2d is configured of, for example, an IGBT (insulated gate bipolar transistor), and a diode connected in anti-parallel to the IGBT.

In FIG. 1, the power conversion device 50 is a bidirectional type such that bidirectional power conversion can be carried out between the low voltage side and the high voltage side, wherein an input voltage (a low voltage side voltage) V1 input between P1 and N1, which are low voltage side terminals, is stepped up to a voltage equal to or greater than the input voltage V1, and an output voltage (a high voltage side voltage) V2 after the stepping up is output between P2 and N2, which are high voltage side terminals.

One end of the first semiconductor switching circuit 2a is connected to a negative electrode side terminal of the low voltage side capacitor 3. One end of the second semiconductor switching circuit 2b is connected to the other end of the first semiconductor switching circuit 2a, and the other end is connected via the reactor 1 to a positive electrode side terminal of the low voltage side capacitor 3. One end of the third semiconductor switching circuit 2c is connected to the other end of the second semiconductor switching circuit 2b. One end of the fourth semiconductor switching circuit 2d is connected to the other end of the third semiconductor switching circuit 2c, and the other end is connected to a positive electrode side terminal of the high voltage side capacitor 4. Furthermore, one end of the intermediate capacitor 5 is connected to an intermediate connection point of the first semiconductor switching circuit 2a and the second semiconductor switching circuit 2b, and the other end is connected to an intermediate connection point of the third semiconductor switching circuit 2c and the fourth semiconductor switching circuit 2d.

Also, the low voltage side capacitor 3 smoothes the input voltage V1. The reactor 1 is for accumulating energy. The semiconductor module 2 and the intermediate capacitor 5 step the input voltage V1 up to the output voltage V2. In the embodiment, each of the semiconductor switching circuits 2a to 2d of the semiconductor module 2 is turned on when a gate signal is high. The high voltage side capacitor 4 smoothes the output voltage V2. The control means 6 generates a gate signal for each of the semiconductor switching circuits 2a to 2d, and causes each of the semiconductor switching circuits 2a to 2d to perform an on-off operation using a switching frequency fsw (a switching cycle Tsw).

Two states, those being a state wherein the motor 52 is driven by power being supplied from the high voltage battery 51 to the motor 52 (a powering operation) and a state wherein power generated with the motor 52 in a power generating state is being supplied to the high voltage battery 51 (a regenerating operation), exist as operating states of the power conversion device 50 in a steady state.

FIG. 2A, FIG. 2B, FIG. 2C, and FIG. 2D are circuit diagrams for describing operating modes of the first embodiment of the invention. As operating modes of the power conversion device in a steady state, there are a first operating mode to a fourth operating mode, as shown in FIG. 2A, FIG. 2B, FIG. 2C, and FIG. 2D.

Figure 2A:
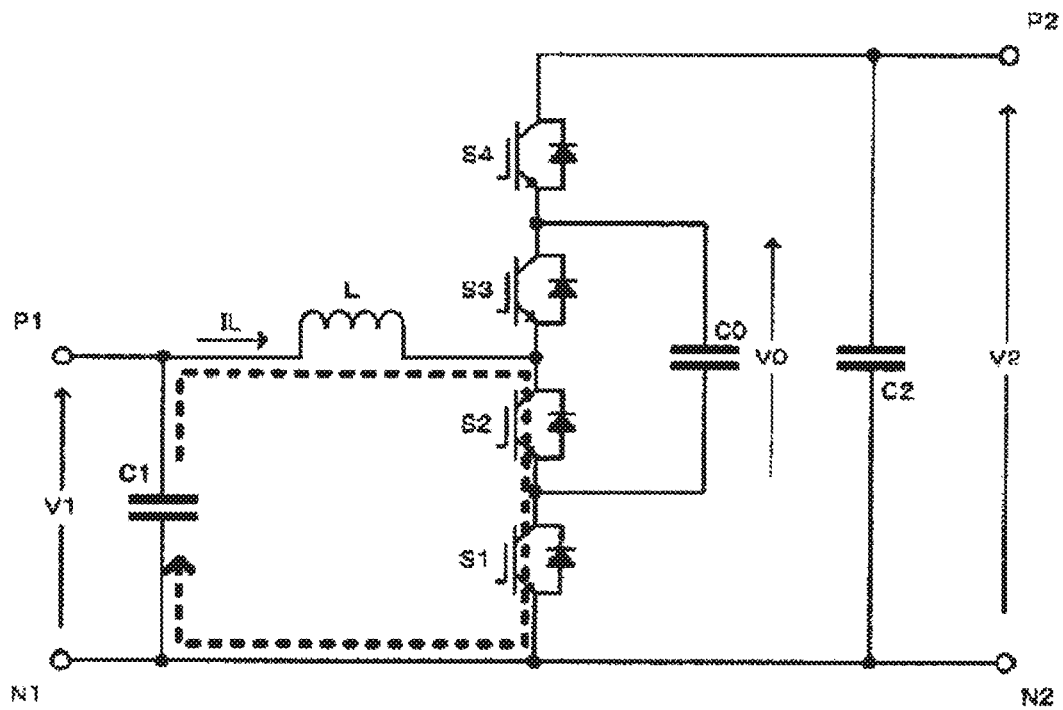
FIG. 2A is a circuit diagram for describing a first operating mode of the first embodiment of the invention.

As shown in FIG. 2A, the first operating mode is such that the first semiconductor switching circuit 2a and the second semiconductor switching circuit 2b are in an on-state, the third semiconductor switching circuit 2c and the fourth semiconductor switching circuit 2d are in an off-state, and there is a state of accumulating energy in the reactor 1 when powering, and a state of discharging the energy of the reactor 1 when regenerating.

Figure 2B:
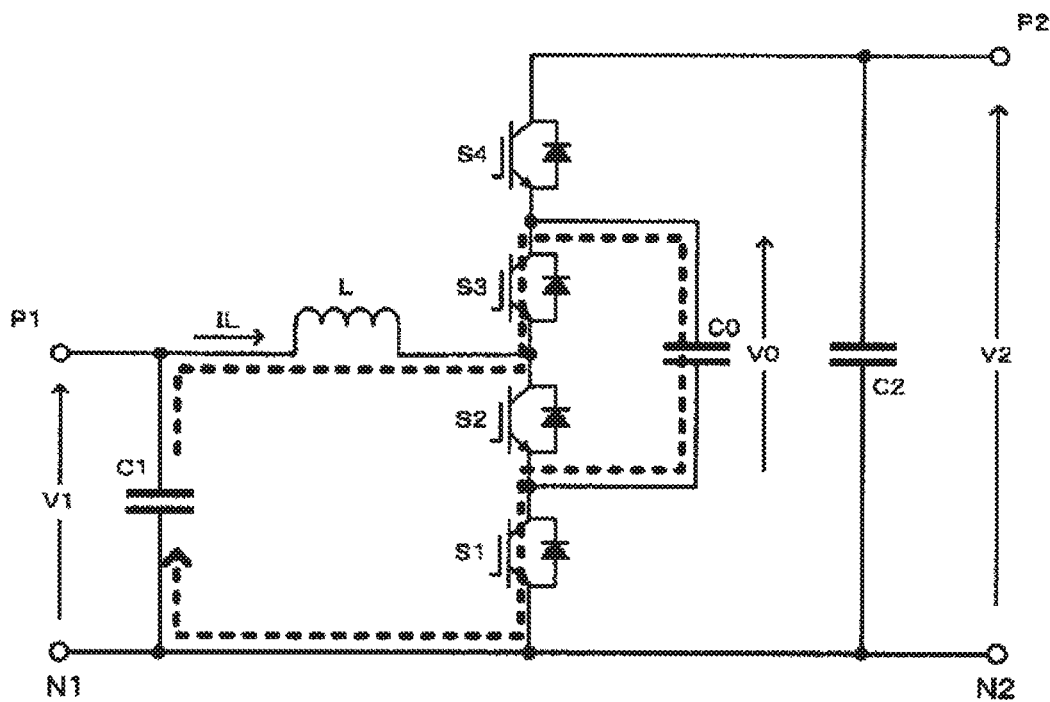
FIG. 2B is a circuit diagram for describing a second operating mode of the first embodiment of the invention.

As shown in FIG. 2B, the second operating mode is such that the first semiconductor switching circuit 2a and the third semiconductor switching circuit 2c are in an on-state, the second semiconductor switching circuit 2b and the fourth semiconductor switching circuit 2d are in an off-state, and there is a state of accumulating energy in the intermediate capacitor 5 when powering, and a state of discharging the energy of the intermediate capacitor 5 when regenerating.

Figure 2C:
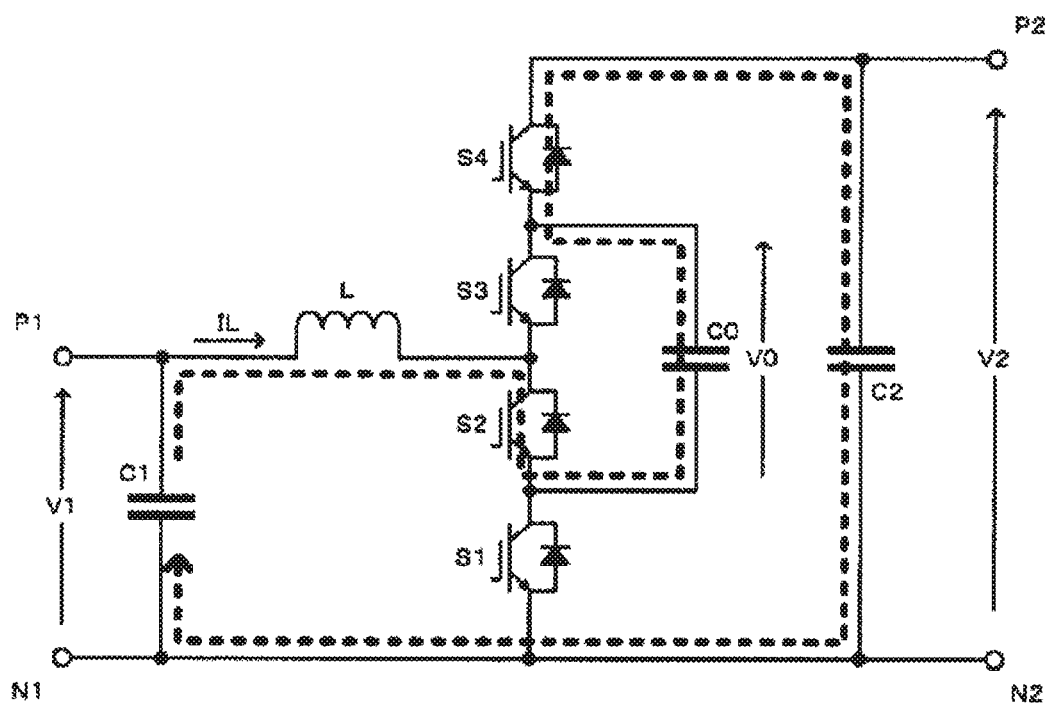
FIG. 2C is a circuit diagram for describing a third operating mode of the first embodiment of the invention.

As shown in FIG. 2C, the third operating mode is such that the second semiconductor switching circuit 2b and the fourth semiconductor switching circuit 2d are in an on-state, the first semiconductor switching circuit 2a and the third semiconductor switching circuit 2c are in an off-state, and there is a state of discharging energy of the intermediate capacitor 5 when powering, and a state of accumulating energy in the intermediate capacitor 5 when regenerating.

Figure 2D:
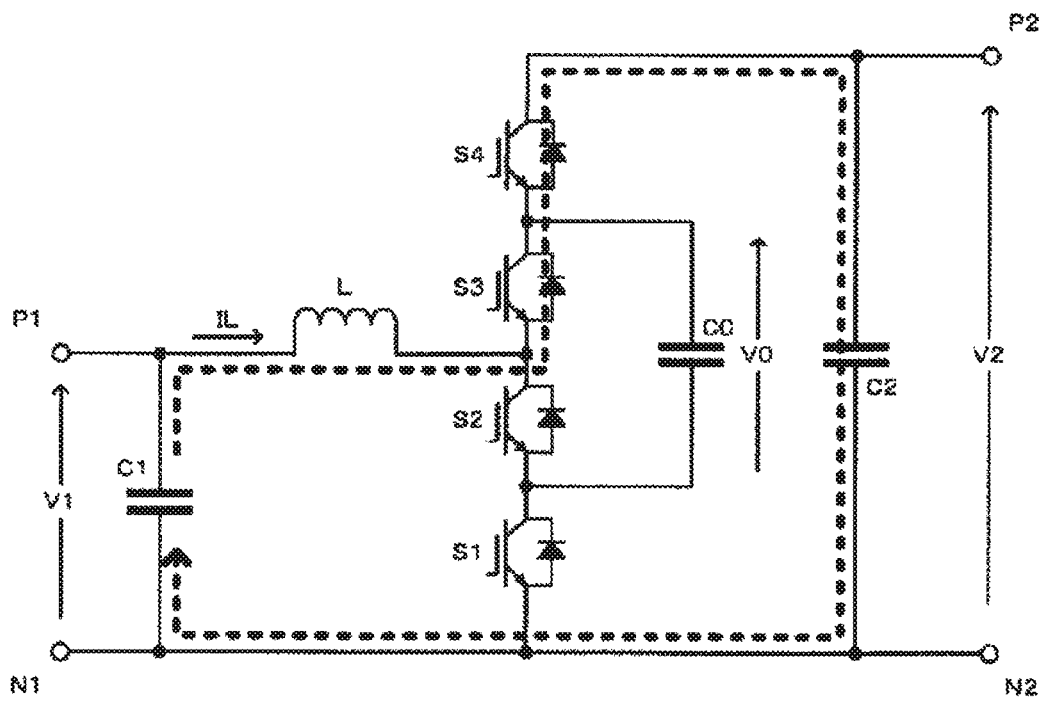
FIG. 2D is a circuit diagram for describing a fourth operating mode of the first embodiment of the invention.

As shown in FIG. 2D, the fourth operating mode is such that the third semiconductor switching circuit 2c and the fourth semiconductor switching circuit 2d are in an on-state, the first semiconductor switching circuit 2a and the second semiconductor switching circuit 2b are in an off-state, and there is a state of discharging energy of the reactor 1 when powering, and a state of accumulating energy in the reactor 1 when regenerating.

By adjusting time ratios of the operating modes as appropriate, the input voltage V1, which is a low voltage side voltage input between the terminal P1 and the terminal N1, can be stepped up to an arbitrary voltage, and output as the output voltage V2 between the terminal P2 and the terminal N2. The power conversion device 50 is such that feedback control is carried out by the control means 6 so that a detected value of the end-to-end voltage V0 (a V0 detected value) of the intermediate capacitor 5 detected by the voltage sensor 7 and a target value of the end-to-end voltage V0 (a V0 target value), which is a voltage that is one-half of the output voltage V2, coincide.

Note that the power conversion device 50 is such that an operation in a steady state differs between when a step-up ratio N of the output voltage V2 with respect to the input voltage V1 is less than 2 times and when the step-up ratio is two times or greater. A magnitude relationship between the input voltage V1, the output voltage V2, and the end-to-end voltage V0 is output voltage V2>input voltage V1>end-to-end voltage V0 in the case of the former, and output voltage V2>end-to-end voltage V0>input voltage V1> in the case of the latter.

Firstly, a description will be given of an operation when in a powering state, with the step-up ratio N at less than 2 times.

Figure 3:
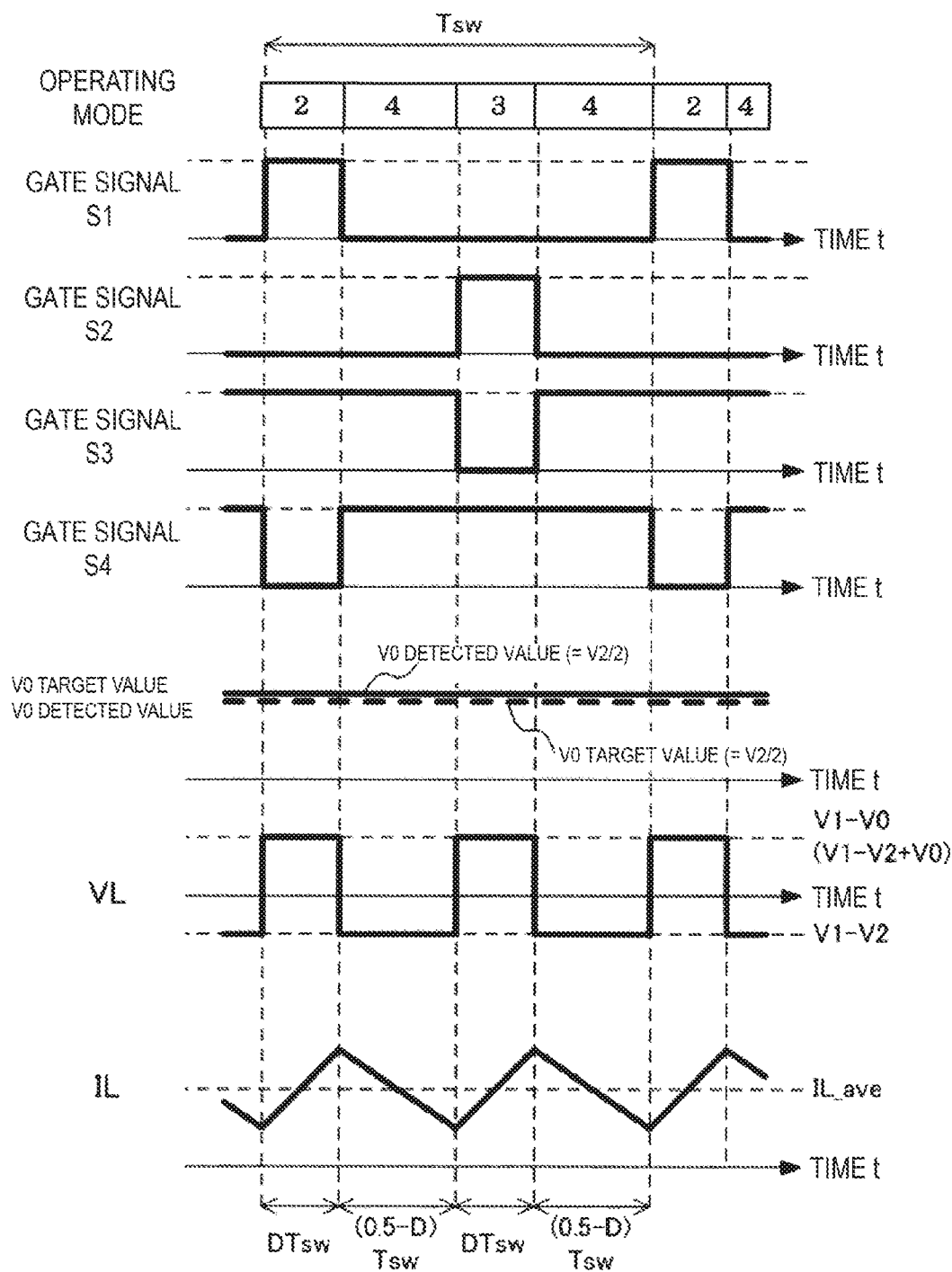
FIG. 3 is a timing diagram for describing a circuit operation of the first embodiment of the invention when a step-up ratio N is less than 2 times, and when in a powering state.

FIG. 3 is a timing diagram for describing a circuit operation of the first embodiment of the invention when the step-up ratio N is less than 2 times, and when in a powering state. FIG. 3 represents a relationship in an operating mode between gate signals S1, S2, S3, and S4 of the first to fourth semiconductor switching circuits 2a to 2d, the V0 target value and the V0 detected value, an end-to-end voltage VL of the reactor 1 (L), and a current IL flowing through the reactor 1. IL_ave is an average value of the current IL flowing through the reactor 1.

Firstly, the second operating mode is adopted as the operating mode, as shown in FIG. 3. In this case, energization is carried out along a path from the low voltage side capacitor 3 (C1) through the reactor 1 (L), the third semiconductor switching circuit 2c (S3), the intermediate capacitor 5 (C0), and the first semiconductor switching circuit 2a (S1) to the low voltage side capacitor 3 (C1), whereby energy of direct current voltage of the low voltage side capacitor 3 shifts to the reactor 1 and the intermediate capacitor 5. Also, input voltage V1−end-to-end voltage V0 is applied across the reactor 1.

An IL change amount ΔIL_mode2 in the second operating mode is expressed by Equation (1) using an end-to-end voltage VL_mode2 of the reactor 1 in the second operating mode, an inductance L of the reactor 1, and a time ΔT_mode2 of the second operating mode.

Herein, D is an on-state duty ratio of the first semiconductor switching circuit 2a, and is expressed as D=1−input voltage V1/output voltage V2. As input voltage V1−end-to-end voltage V0 is a positive value, a direction of change of ΔIL_mode2 is positive. (Input voltage V1−end-to-end voltage V0)/L in Equation (1) is a value representing an IL change rate (inclination), and is defined as M_mode2.

[Math. 1]

$$VL\_mode2 = L \cdot \Delta IL\_mode2 / \Delta T\_mode2 \Rightarrow \Delta IL\_mode2 = \\ VL\_mode2 \cdot \Delta T\_mode2 / L = (V1 - V0) \cdot D \cdot Tsw / L \quad (1)$$

Next, the fourth operating mode is adopted as the operating mode. In this case, energization is carried out along a path from the reactor 1 (L) through the third semiconductor switching circuit 2c (S3), the fourth semiconductor switching circuit 2d (S4), the high voltage side capacitor 4 (C2), and the low voltage side capacitor 3 (C1) to the reactor 1 (L), whereby energy accumulated in the reactor 1 shifts to the high voltage side capacitor 4. Also, input voltage V1−output voltage V2 (input voltage V1−2 end-to-end voltage V0) is applied across the reactor 1. Further, an IL change amount ΔIL_mode4 in the fourth operating mode is expressed by Equation (2) using an end-to-end voltage VL_mode4 of the reactor 1 in the fourth operating mode and a time ΔT_mode4 of the fourth operating mode. Herein, input voltage V1−output voltage V2 is a negative value, because of which a direction of change of ΔIL_mode4 is negative.

|Input voltage V1−2 end-to-end voltage V0|/L in Equation (2) is a value representing an IL change rate, and is defined as M_mode4.

[Math. 2]

$$VL\_mode4 = L \cdot \Delta IL\_mode4 / \Delta T\_mode4 \Rightarrow \Delta IL\_mode4 = \\ VL\_mode4 \cdot \Delta T\_mode4 / L = \\ |V1 - V2| \cdot (0.5 - D) \cdot Tsw / L = |V1 - 2V0| \cdot (0.5 - D) \cdot Tsw / L \quad (2)$$

Next, the third operating mode is adopted as the operating mode. In this case, energization is carried out along a path from the intermediate capacitor 5 (C0) through the fourth semiconductor switching circuit 2d (S4), the high voltage side capacitor 4 (C2), the low voltage side capacitor 3 (C1), the reactor 1 (L), and the second semiconductor switching circuit 2b (S2) to the intermediate capacitor 5 (C0), whereby energy accumulated in the intermediate capacitor 5 shifts to the high voltage side capacitor 4, and energy is accumulated in the reactor 1. Also, input voltage V1−output voltage V2+end-to-end voltage V0 (=input voltage V1−end-to-end voltage V0) is applied across the reactor 1. Further, an IL change amount ΔIL_mode3 in the third operating mode is expressed by Equation (3) using an end-to-end voltage VL_mode3 of the reactor 1 in the third operating mode and a time ΔT_mode3 of the third operating mode. As input voltage V1−output voltage V2+end-to-end voltage V0 (=input voltage V1−end-to-end voltage V0) is a positive value, a direction of change of ΔIL_mode3 is positive.

(Input voltage V1−end-to-end voltage V0)/L in Equation (3) is a value representing an IL change rate, and is defined as M_mode3.

[Math. 3]

$$VL\_mode3 = L \cdot \Delta IL\_mode3 / \Delta T\_mode3 \Rightarrow \Delta IL\_mode3 = \qquad (3)$$
$$VL\_mode3 \cdot \Delta T\_mode3 / L =$$
$$(V1 - V2 + V0) \cdot D \cdot Tsw / L = (V1 - V0) \cdot D \cdot Tsw / L$$

Next, the fourth operating mode is adopted as the operating mode. In this case, as previously described, energization is carried out along a path from the reactor 1 (L) through the third semiconductor switching circuit 2c (S3), the fourth semiconductor switching circuit 2d (S4), the high voltage side capacitor 4 (C2), and the low voltage side capacitor 3 (C1) to the reactor 1 (L), whereby energy accumulated in the reactor 1 shifts to the high voltage side capacitor 4. An IL change amount and change rate are the same as previously mentioned.

By this series of "second operating mode to fourth operating mode to third operating mode to fourth operating mode" being repeated, the input voltage V1 is stepped up to an arbitrary voltage one time to less than two times greater, and output as the output voltage V2, while maintaining the end-to-end voltage V0 at a voltage that is one-half of the output voltage V2.

Also, as shown in FIG. 3, an absolute value of the change amount of current flowing through the reactor 1 and an average value of current flowing through the reactor 1 are the same in each operating mode. Further, the change rate of current flowing through the reactor 1 is of the same value in the second operating mode and the third operating mode.

Next, a description will be given of an operation when in a powering state, with the step-up ratio N at 2 times or greater.

FIG. 4 is a timing diagram for describing a circuit operation of the first embodiment of the invention when the step-up ratio N is 2 times or greater, and when in a powering state. FIG. 4 represents a relationship in an operating mode between the gate signals S1, S2, S3, and S4 of the first to fourth semiconductor switching circuits 2a to 2d, the V0 target value and the V0 detected value, the end-to-end voltage VL of the reactor 1 (L), and the current IL flowing through the reactor 1. IL_ave is an average value of the current IL flowing through the reactor 1.

Firstly, the first operating mode is adopted as the operating mode, as shown in FIG. 4. In this case, energization is carried out along a path from the low voltage side capacitor 3 (C1) through the reactor 1 (L), the second semiconductor switching circuit 2b (S2), and the first semiconductor switching circuit 2a (S1) to the low voltage side capacitor 3 (C1), whereby energy of direct current voltage of the low voltage side capacitor 3 shifts to the reactor 1. Also, the input voltage V1 is applied across the reactor 1.

Further, an IL change amount ΔIL_mode1 in the first operating mode is expressed by Equation (4) using an end-to-end voltage VL_mode1 of the reactor 1 in the first operating mode, the inductance L of the reactor 1, and a time ΔT_mode1 of the first operating mode.

As the input voltage V1 is a positive value, a direction of change of ΔIL_mode1 is positive. Input voltage V1/L in Equation (4) is a value representing the IL change rate, and is defined as M_mode1.

[Math. 4]

$$VL\_mode1 = L \cdot \Delta IL\_mode1 / \Delta T\_mode1 \Rightarrow \Delta IL\_mode1 = \qquad (4)$$
$$VL\_mode1 \cdot \Delta T\_mode1 / L = V1 \cdot (D - 0.5) \cdot Tsw / L$$

Next, the second operating mode is adopted as the operating mode. In this case, energization is carried out along a path from the reactor 1 (L) through the third semiconductor switching circuit 2c (S3), the intermediate capacitor 5 (C0), the first semiconductor switching circuit 2a (S1), and the low voltage side capacitor 3 (C1) to the reactor 1 (L), whereby energy accumulated in the reactor 1 shifts to the intermediate capacitor 5. Also, input voltage V1−end-to-end voltage V0 is applied across the reactor 1.

Further, the IL change amount ΔIL_mode2 in the second operating mode is expressed by Equation (5) using the end-to-end voltage VL_mode2 of the reactor 1 in the second operating mode, the inductance L of the reactor 1, and the time ΔT_mode2 of the second operating mode. As input voltage V1−end-to-end voltage V0 is a negative value, a direction of change of ΔIL_mode2 is negative.

|Input voltage V1−end-to-end voltage V0|/L in Equation (5) is a value representing the IL change rate, and is defined as M_mode2.

[Math. 5]

$$VL\_mode2 = L \cdot \Delta IL\_mode2 / \Delta T\_mode2 \Rightarrow \Delta IL\_mode2 = \qquad (5)$$
$$VL\_mode2 \cdot \Delta T\_mode2 / L = |V1 - V0| \cdot (1 - D) \cdot Tsw / L$$

Next, the first operating mode is adopted as the operating mode. In this case, energization is carried out along a path from the low voltage side capacitor 3 (C1) through the reactor 1 (L), the second semiconductor switching circuit 2b (S2), and the first semiconductor switching circuit 2a (S1) to the low voltage side capacitor 3 (C1), whereby energy of direct current voltage of the low voltage side capacitor 3 (C1) shifts to the reactor 1. The IL change amount is the same as that previously mentioned.

Next, the third operating mode is adopted as the operating mode. In this case, energization is carried out along a path from the intermediate capacitor 5 (C0) through the fourth semiconductor switching circuit 2d (S4), the high voltage side capacitor 4 (C2), the low voltage side capacitor 3 (C1), the reactor 1 (L), and the second semiconductor switching circuit 2b (S2) to the intermediate capacitor 5 (C0), whereby energy accumulated in the intermediate capacitor 5 shifts to the high voltage side capacitor 4, and energy is accumulated in the reactor 1.

Also, input voltage V1−output voltage V2+end-to-end voltage V0 (=input voltage V1−end-to-end voltage V0) is applied across the reactor 1. Further, the IL change amount ΔIL_mode3 in the third operating mode is expressed by Equation (6) using the end-to-end voltage VL_mode3 of the reactor 1 in the third operating mode and the time ΔT_mode3 of the third operating mode.

As input voltage V1−output voltage V2+end-to-end voltage V0 (=input voltage V1−end-to-end voltage V0) is a negative value, a direction of change of ΔIL_mode3 is negative. |Input voltage V1−end-to-end voltage V0|/L in Equation (6) is a value representing the IL change rate, and is defined as M_mode3.

[Math. 6]

$$VL\_mode3 = L \cdot \Delta IL\_mode3 / \Delta T\_mode3 \Rightarrow \Delta IL\_mode3 = \\ VL\_mode3 \cdot \Delta T\_mode3 / L = \\ |V1 - V2 + V0| \cdot (1 - D) \cdot Tsw/L = |V1 - V0| \cdot (1 - D) \cdot Tsw/L \quad (6)$$

By this series of "first operating mode to second operating mode to first operating mode to third operating mode" being repeated, the input voltage V1 is stepped up to an arbitrary voltage two times or more greater, and output as the output voltage V2, while maintaining the end-to-end voltage V0 at a voltage that is one-half of the output voltage V2.

Also, as shown in FIG. 4, the absolute value of the change amount of current flowing through the reactor 1 and the average value of current flowing through the reactor 1 are the same in each operating mode. Further, the change rate of current flowing through the reactor 1 is of the same value in the second operating mode and the third operating mode.

Heretofore, a powering operation of the power conversion device 50 has been described. In the case of a regenerating operation, which is the other operating state, a point differing from the powering operation is only the inclination of current flowing through each of the first to fourth semiconductor switching circuits 2a to 2d, and operations of the switching circuit are the same in both operating states, because of which a description of a regenerating operation will also be omitted from the following description.

The power conversion device 50 is such that control is carried out so that the V0 detected value and the V0 target value coincide using feedback control that is also applied in a general power conversion device. Consequently, when an abnormality occurs in the voltage sensor 7 and the abnormality cannot be detected, feedback control is carried out so that an erroneous V0 detected value and the V0 target value coincide, because of which the V0 true value deviates from the V0 target value.

An abnormality such that a ratio between the V0 detected value and the V0 true value (V0 target value) has a gain other than 1 (hereafter called a gain error), an abnormality such that a deviation between the V0 detected value and the V0 true value (V0 target value) is offset other than to 0 (hereafter called an offset error), and an abnormality of the V0 detected value sticking at a value other than the V0 true value (V0 target value) (hereafter called a sticking error), are cited as examples of the abnormality.

Figure 5A:
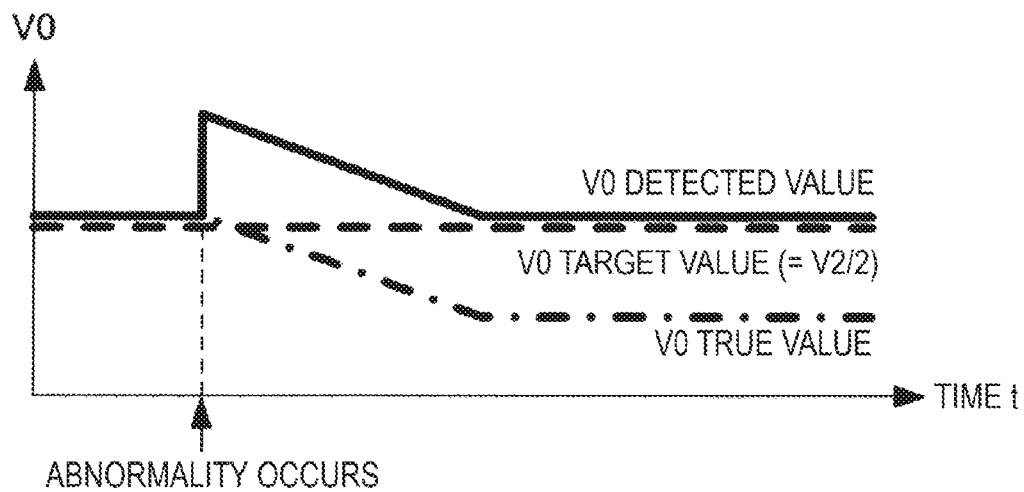
FIG. 5A is a voltage waveform diagram for describing a gain error or an offset error of a voltage sensor of the first embodiment of the invention.
Figure 5B:
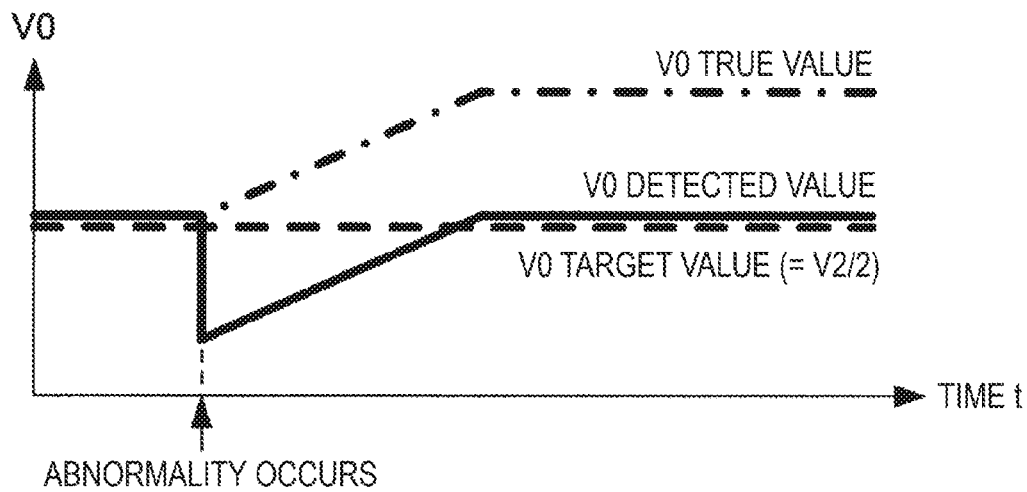
FIG. 5B is a voltage waveform diagram for describing a gain error or an offset error of the voltage sensor of the first embodiment of the invention.

FIG. 5A and FIG. 5B are voltage waveform diagrams for describing a gain error or an offset error of the voltage sensor of the first embodiment of the invention. FIG. 5A is a voltage waveform diagram of a case in which an abnormality such that the V0 detected value becomes greater than the V0 true value occurs. In this case, the V0 true value becomes smaller than the V0 target value as a result of feedback control. Meanwhile, FIG. 5B is a voltage waveform diagram of a case in which an abnormality such that the V0 detected value becomes smaller than the V0 true value occurs. In this case, the V0 true value becomes greater than the V0 target value as a result of feedback control.

Figure 6A:
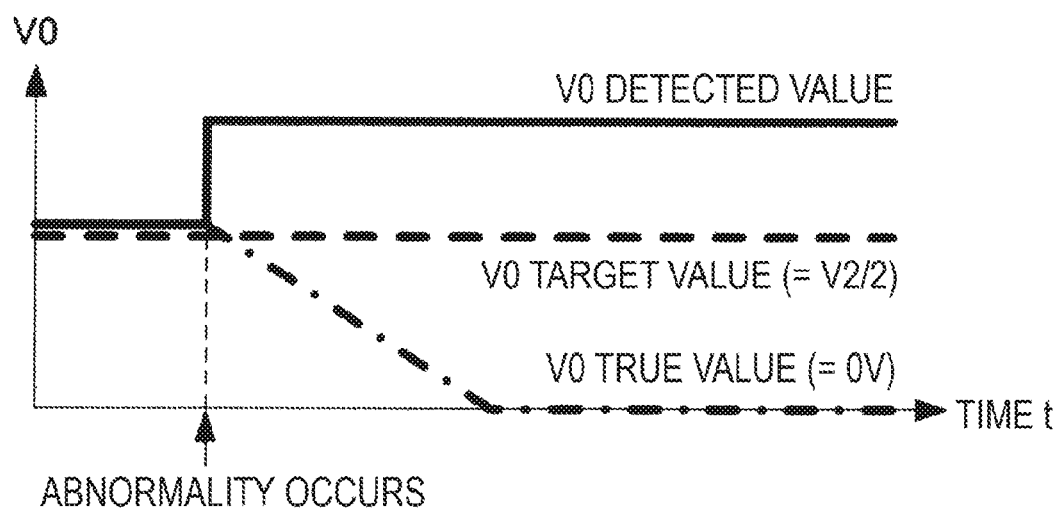
FIG. 6A is a voltage waveform diagram for describing a sticking error of the voltage sensor of the first embodiment of the invention.
Figure 6B:
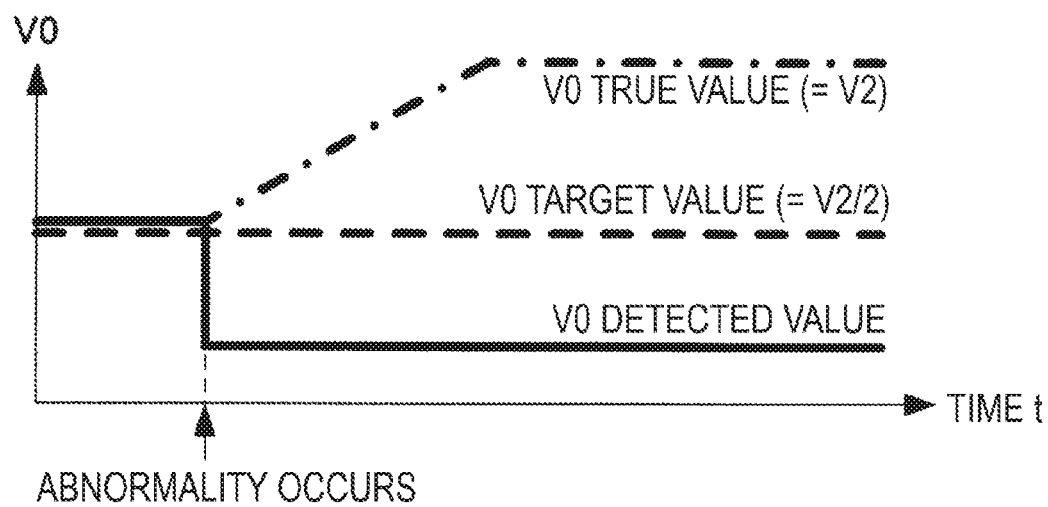
FIG. 6B is a voltage waveform diagram for describing a sticking error of the voltage sensor of the first embodiment of the invention.

FIG. 6A and FIG. 6B are voltage waveform diagrams for describing a sticking error of the voltage sensor of the first embodiment of the invention. FIG. 6A is a voltage waveform diagram of a case in which a sticking error such that the V0 detected value becomes greater than the V0 true value occurs. In this case, a positive difference of the V0 detected value with respect to the V0 target value does not become zero, and the V0 true value becomes 0V as a result of feedback control. Meanwhile, FIG. 6B is a voltage waveform diagram of a case in which a sticking abnormality such that the V0 detected value becomes smaller than the V0 true value occurs. In this case, a negative difference of the V0 detected value with respect to the V0 target value does not become zero, and the V0 true value becomes equal to the output voltage V2 as a result of feedback control. In the case of a gain error or an offset error too, the V0 true value becomes 0V or equal to the output voltage V2 as a result of feedback control when an abnormality such that the V0 detected value deviates considerably from the V0 true value occurs.

Figure 7:
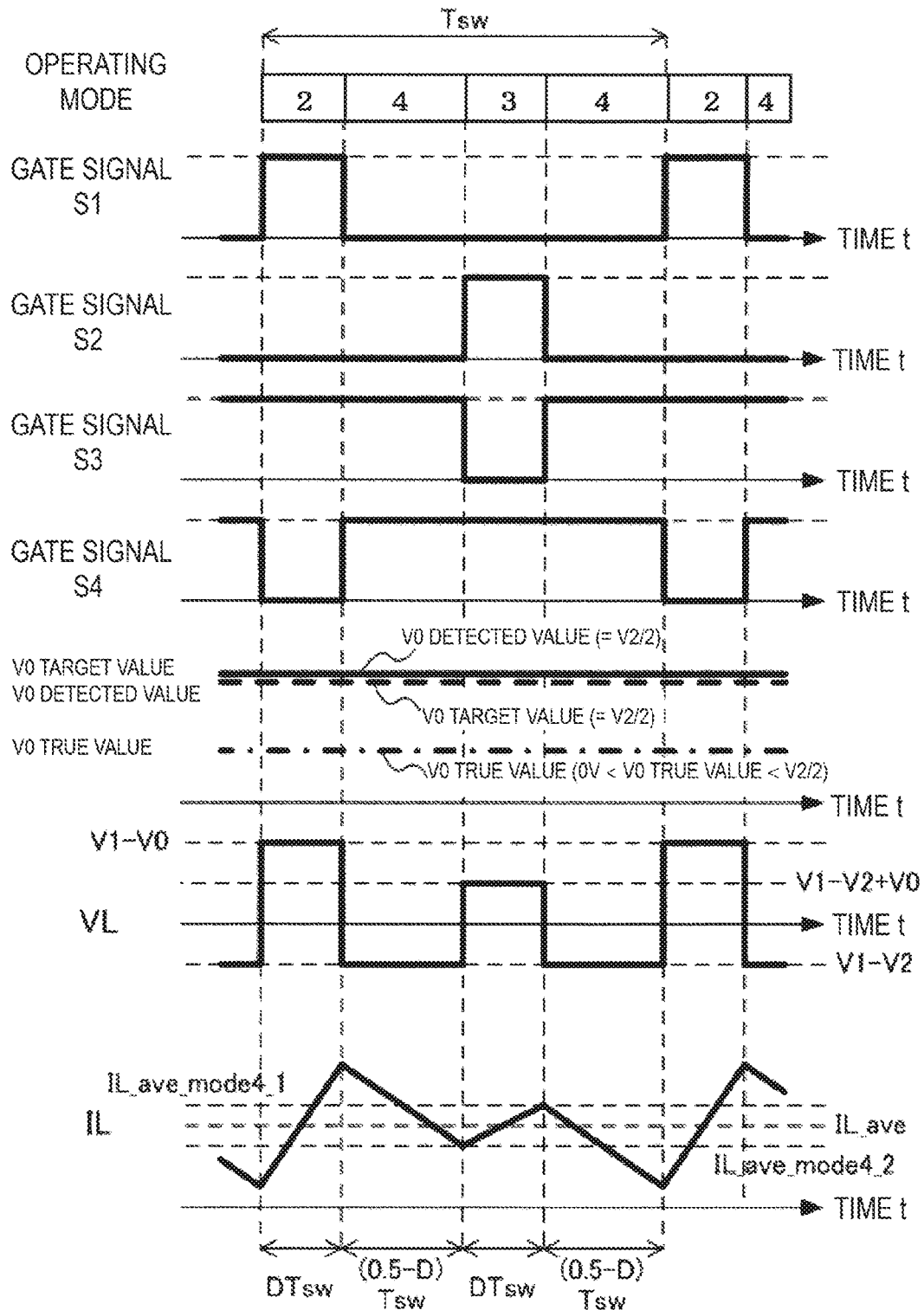
FIG. 7 is a timing diagram of a case in which an abnormality occurs in the voltage sensor of the first embodiment of the invention.

FIG. 7 is a timing diagram of a case in which an abnormality occurs in the voltage sensor of the first embodiment of the invention. Herein, FIG. 7 shows a case in which the step-up ratio N is less than 2 times and the state is a powering state. FIG. 7 is a timing diagram of a case in which 0V<V0 true value<output voltage V2/2 as a result of a gain error or an offset error occurring. FIG. 7 represents a relationship in an operating mode between the gate signals S1, S2, S3, and S4 of the first to fourth semiconductor switching circuits 2a to 2d, the V0 target value, the V0 detected value, and the V0 true value, the end-to-end voltage VL of the reactor 1 (L), and the current IL flowing through the reactor 1 in the operating mode. IL_ave is an average value of the current IL flowing through the reactor 1.

Herein, a description will be given of a temporal change of the end-to-end voltage VL of the reactor 1 and the current IL change amount ΔIL_mode2−ΔIL_mode4 in each operating mode when the relevant abnormality occurs. The timing diagrams shown in the previously described FIG. 3 and FIG. 4 are timing diagrams of a case in which the voltage sensor 7 is normal.

Firstly, input voltage V1−end-to-end voltage V0 is applied across the reactor 1 in the second operating mode, in the same way as when the voltage sensor is normal (FIG. 3), but as 0V<V0 true value<output voltage V2/2 when the relevant abnormality occurs, input voltage V1−end-to-end voltage V0 increases in comparison with a normal time. Consequently, ΔIL_mode2 and M_mode2 also increase in comparison with a normal time. Also, an average value IL_ave_mode2 of current flowing through the reactor 1 in this operating mode is the same as at a normal time (IL_ave).

Next, in the fourth operating mode, input voltage V1−output voltage V2 is applied across the reactor 1, in the same way as the waveform at a normal time, and ΔIL_mode4 and M_mode4 are also the same as at a normal time. Note that an average value IL_ave_mode4_1 of current flowing through the reactor 1 in this operating mode (the fourth operating mode after the second operating mode) increases in comparison with a normal time (IL_ave).

Next, in the third operating mode, input voltage V1−output voltage V2+end-to-end voltage V0 is applied across the reactor 1, in the same way as at a normal time, but as 0V<V0 true value<output voltage V2/2 when the relevant abnormality occurs, input voltage V1−output voltage V2+end-to-end voltage V0 decreases in comparison with a normal time. Consequently, ΔIL_mode3 and M_mode3 also decrease in comparison with a normal time. Also, an average value IL_ave_mode3 of current flowing through the reactor 1 in this operating mode is the same as at a normal time (IL_ave).

Next, in the fourth operating mode, ΔIL_mode4 and M_mode4 are the same as at a normal time, as previously described. Note that an average value IL_ave_mode4_2 of current flowing through the reactor 1 in this mode (the fourth operating mode after the third operating mode) decreases in comparison with a normal time (IL_ave).

As heretofore described, ΔIL_mode2 and ΔIL_mode3 are of different values to ΔIL_mode4, IL_ave_mode4_1 and IL_ave_mode4_2 are of different values to IL_ave_mode2 and IL_ave_mode3 (=IL_ave), and M_mode2 is of a different value to M_mode3, when the relevant abnormality occurs.

Figure 8:
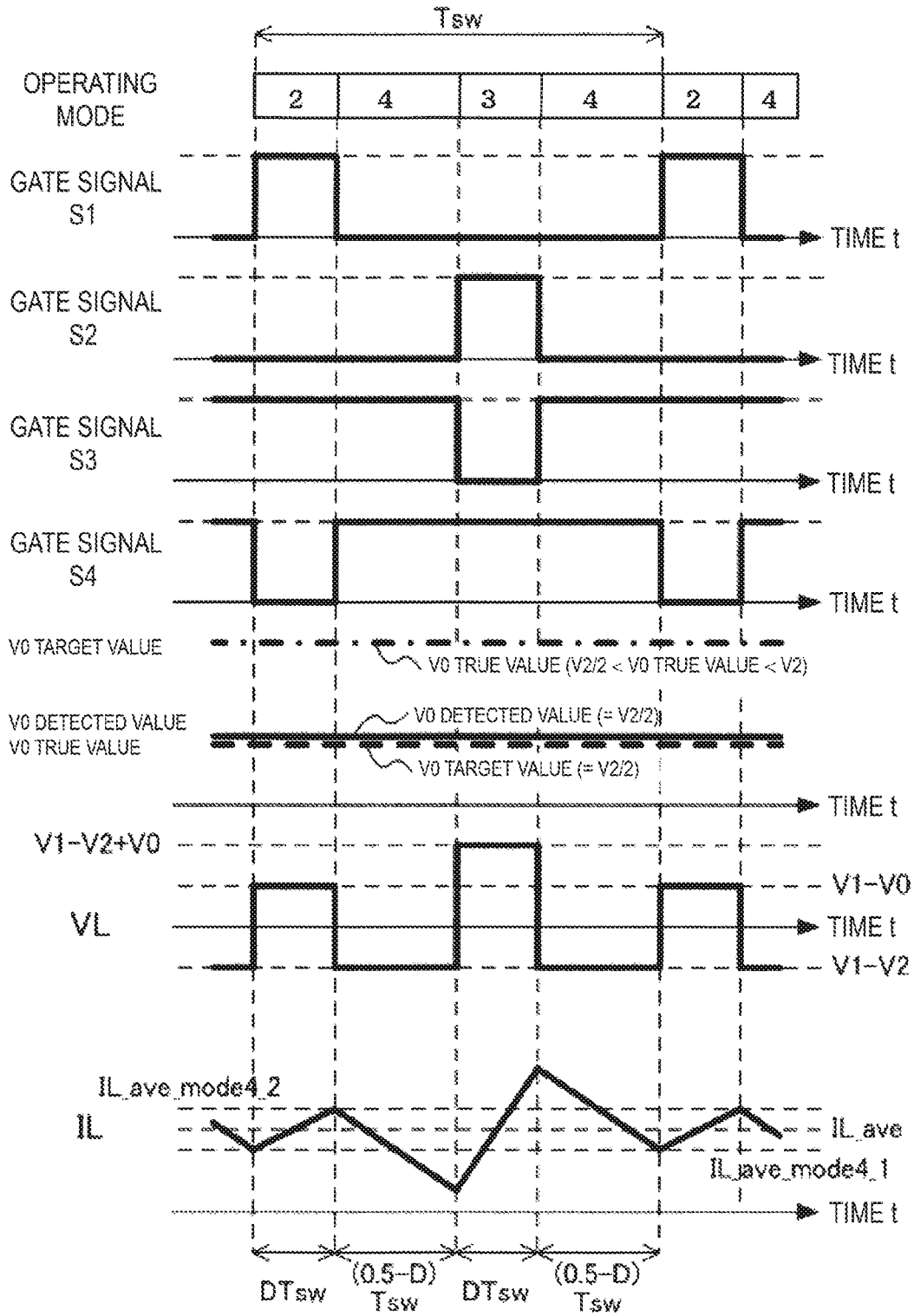
FIG. 8 is another timing diagram of a case in which an abnormality occurs in the voltage sensor of the first embodiment of the invention.

Meanwhile, FIG. 8 is a timing diagram of a case in which output voltage V2/2<V0 true value<output voltage V2 as a result of a gain error or an offset error occurring. In this case, when comparing with FIG. 7, VL and IL in the second operating mode and VL and IL in the third operating mode are interchanged, and a magnitude relationship between ΔIL_mode2 and ΔIL_mode3, and between IL_ave_mode4_1 and IL_ave_mode4_2, is interchanged.

Figure 9:
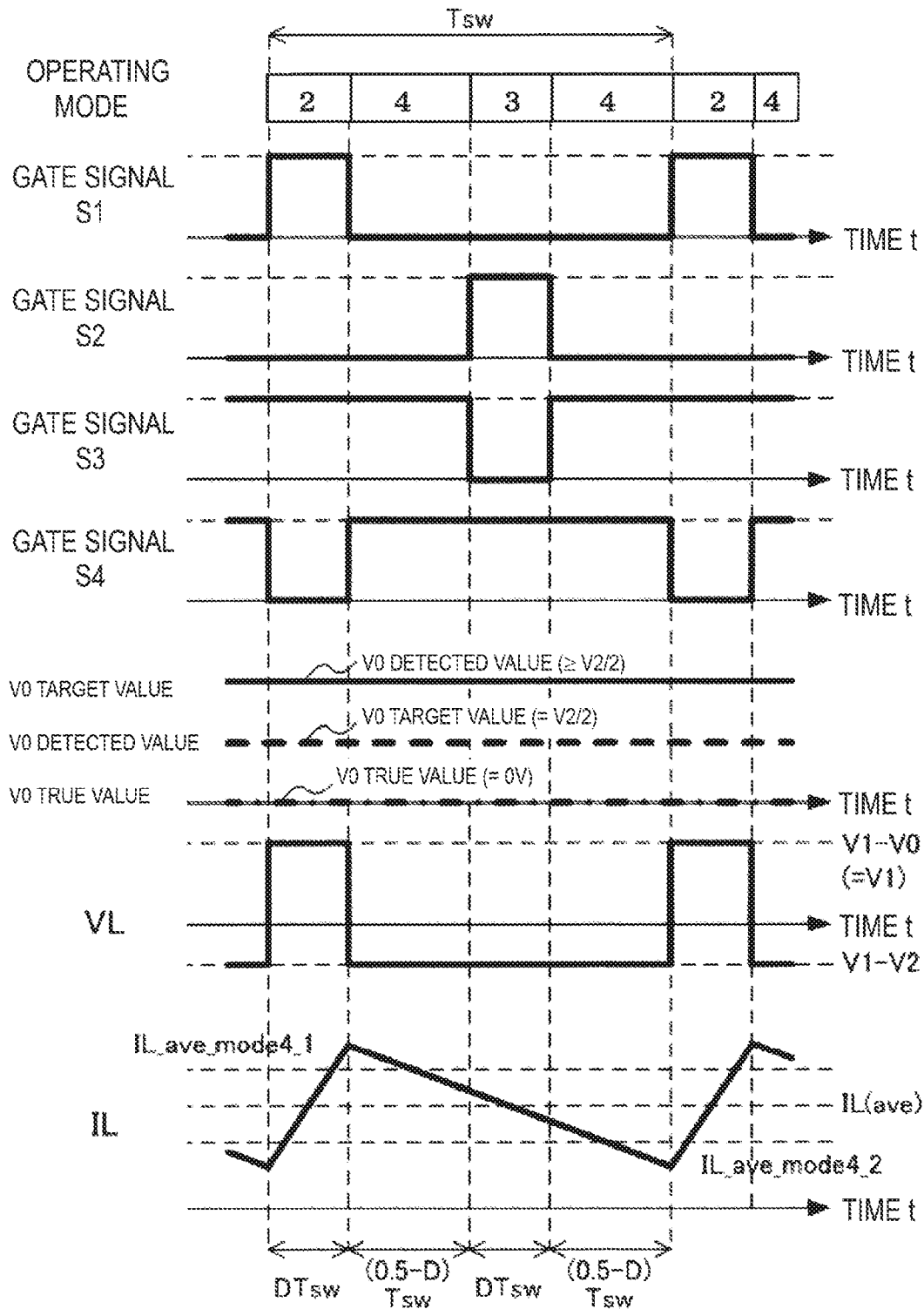
FIG. 9 is still another timing diagram of a case in which an abnormality occurs in the voltage sensor of the first embodiment of the invention.

FIG. 9 is another timing diagram of a case in which an abnormality occurs in the voltage sensor of the first embodiment of the invention. Herein, FIG. 9 shows a case in which the step-up ratio N is less than 2 times and the state is a powering state. FIG. 9 is a timing diagram of a case in which the V0 true value is 0V as a result of a gain error, an offset error, or a sticking error occurring.

In this case, input voltage V1−end-to-end voltage V0 (positive) is applied across the reactor 1 in the second operating mode, and input voltage V1−output voltage V2 (negative) is applied in three sections from the fourth operating mode through the third operating mode to the fourth operating mode. Consequently, an IL cycle is the same as the switching cycle Tsw of each of the semiconductor switching circuits 2a to 2d. In the same way as in FIG. 7, ΔIL_mode2 and ΔIL_mode3 are of different values to ΔIL_mode4, IL_ave_mode4_1 and IL_ave_mode4_2 are of different values to IL_ave_mode2 and IL_ave_mode3 (=IL_ave), and M_mode2 is of a different value to M_mode3.

Figure 10:
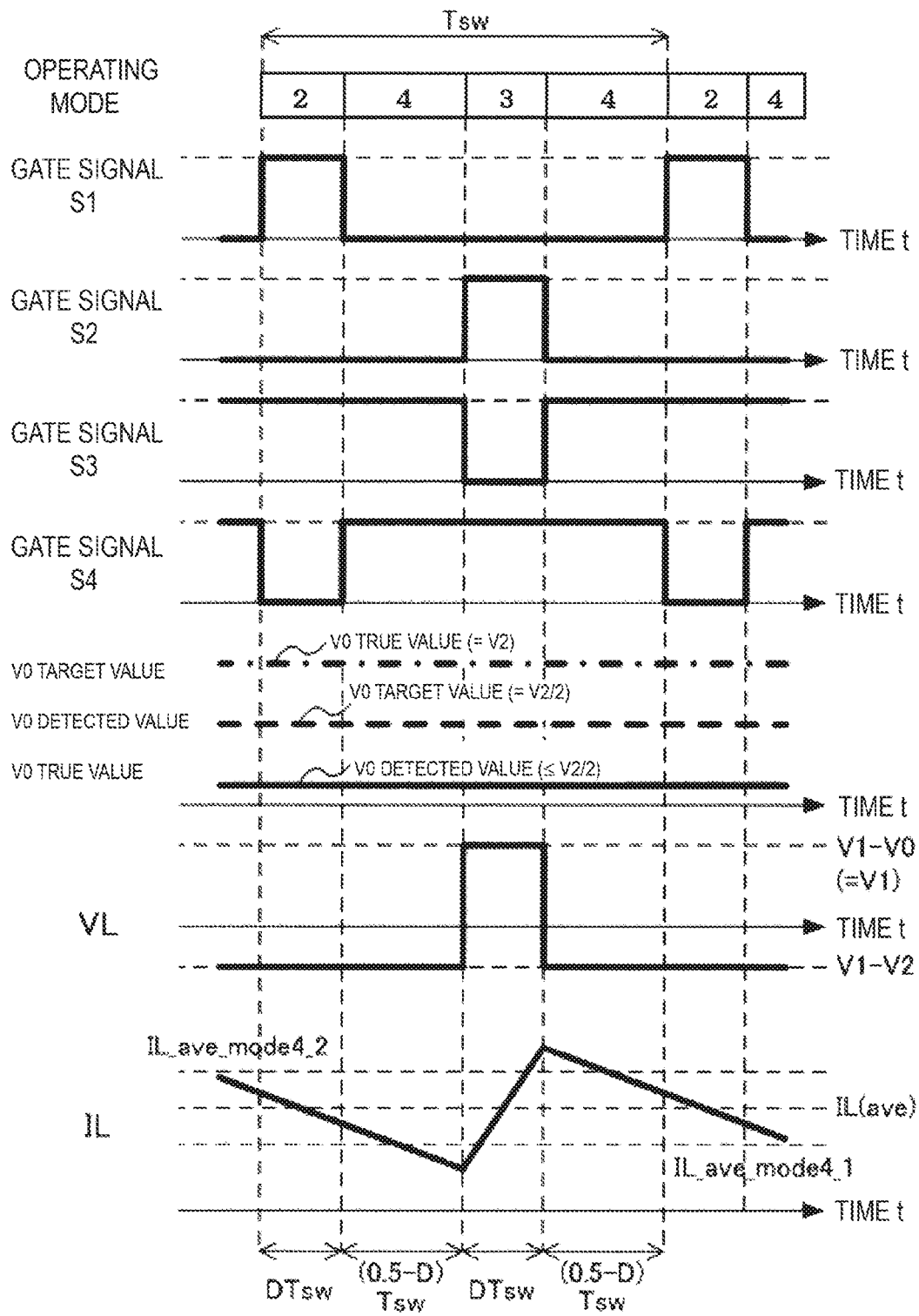
FIG. 10 is still another timing diagram of a case in which an abnormality occurs in the voltage sensor of the first embodiment of the invention.

Meanwhile, FIG. 10 is a timing diagram of a case in which the V0 true value becomes equal to the output voltage V2 as a result of a gain error, an offset error, or a sticking error occurring. In this case, when comparing with FIG. 9, VL and IL in the second operating mode and VL and IL in the third operating mode are interchanged, and a magnitude relationship between ΔIL_mode2 and ΔIL_mode3, and between IL_ave_mode4_1 and IL_ave_mode4_2, is interchanged.

Figure 11:
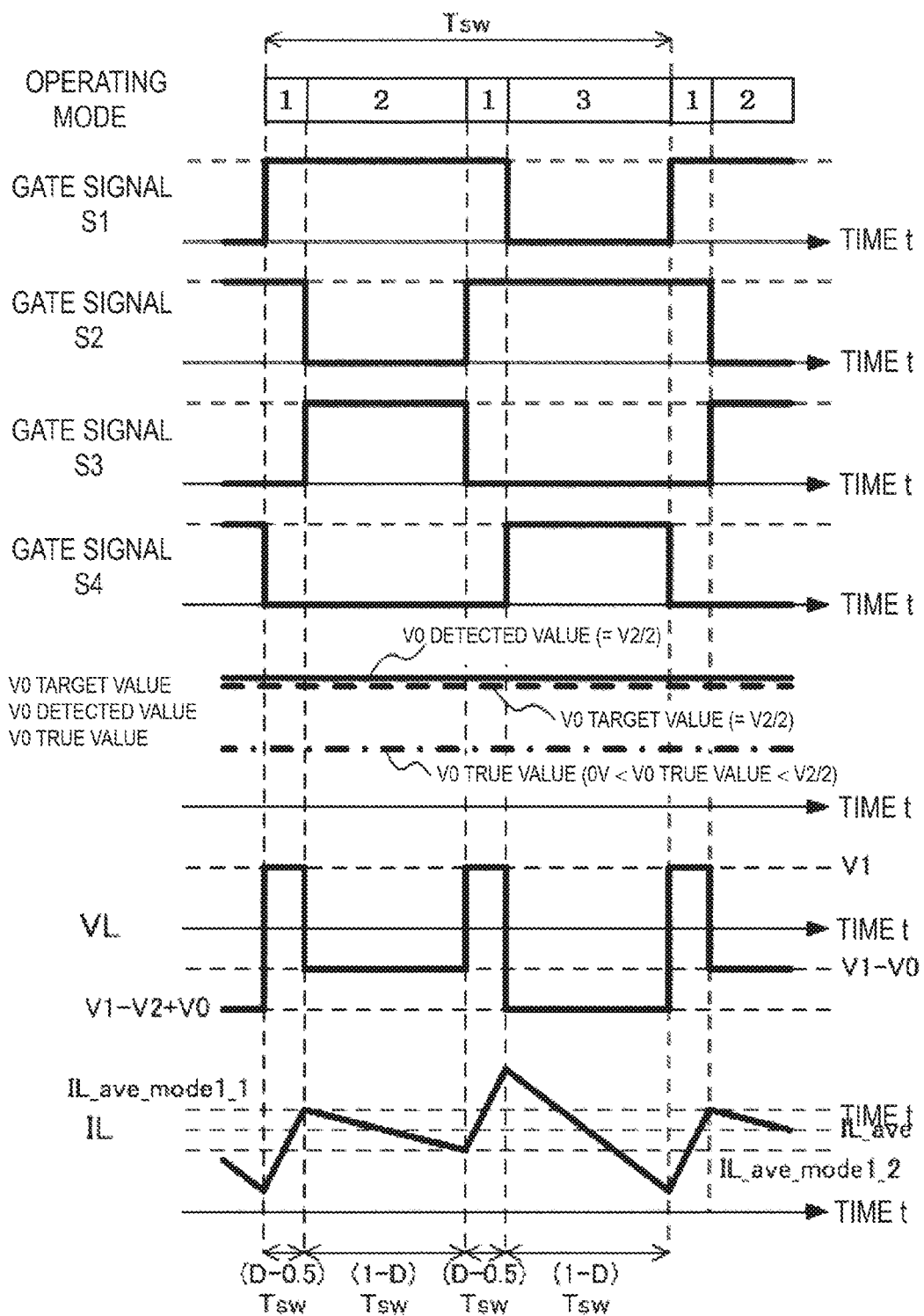
FIG. 11 is still another timing diagram of a case in which an abnormality occurs in the voltage sensor of the first embodiment of the invention.

FIG. 11 is still another timing diagram of a case in which an abnormality occurs in the voltage sensor of the first embodiment of the invention. Herein, FIG. 11 shows a case in which the step-up ratio N is 2 times or greater, and the state is a powering state. FIG. 11 is a timing diagram of a case in which 0V<V0 true value<output voltage V2/2 as a result of a gain error or an offset error occurring.

Herein, a description will be given of a temporal change of the end-to-end voltage VL of the reactor 1 and the current IL change amount ΔIL_mode1−ΔIL_mode3 in each operating mode when the relevant abnormality occurs.

Firstly, the input voltage V1 is applied across the reactor 1 in the first operating mode, in the same way as when the voltage sensor is normal (FIG. 4), and ΔIL_mode1 and M_mode1 are also the same as at a normal time. Note that an average value IL_ave_mode1_2 of current flowing through the reactor 1 in this operating mode (the first operating mode after the third operating mode) decreases in comparison with a normal time (IL_ave).

Next, in the second operating mode, input voltage V1−end-to-end voltage V0 is applied across the reactor 1, in the same way as at a normal time, but as 0V<V0 true value<output voltage V2/2 when the relevant abnormality occurs, |input voltage V1−end-to-end voltage V0| decreases in comparison with a normal time. Consequently, ΔIL_mode2 and M_mode2 also decrease in comparison with a normal time. Also, the average value IL_ave_mode2 of current flowing through the reactor 1 in this operating mode is the same as at a normal time (IL_ave).

Next, in the first operating mode, input voltage V1 is applied across the reactor 1, in the same way as at a normal time, and ΔIL_mode1 and M_mode1 are also the same as at a normal time. Note that an average value IL_ave_mode1_1 of current flowing through the reactor 1 in this operating mode (the first operating mode after the second operating mode) increases in comparison with a normal time (IL_ave).

Next, in the third operating mode, input voltage V1−output voltage V2+end-to-end voltage V0 is applied across the reactor 1, in the same way as at a normal time, but as 0V<V0 true value<output voltage V2/2 when the relevant abnormality occurs, |input voltage V1−output voltage V2+end-to-end voltage V0| increases in comparison with a normal time. Consequently, ΔIL_mode3 and M_mode3 also increase in comparison with a normal time. Also, the average value IL_ave_mode3 of current flowing through the reactor 1 in this operating mode is the same as at a normal time (IL_ave).

As heretofore described, ΔIL_mode2 and ΔIL_mode3 are of different values to ΔIL_mode1, IL_ave_mode1_1 and IL_ave_mode1_2 are of different values to IL_ave_mode2 and IL_ave_mode3 (=IL_ave), and M_mode2 is of a different value to M_mode3, when the relevant abnormality occurs.

Figure 12:
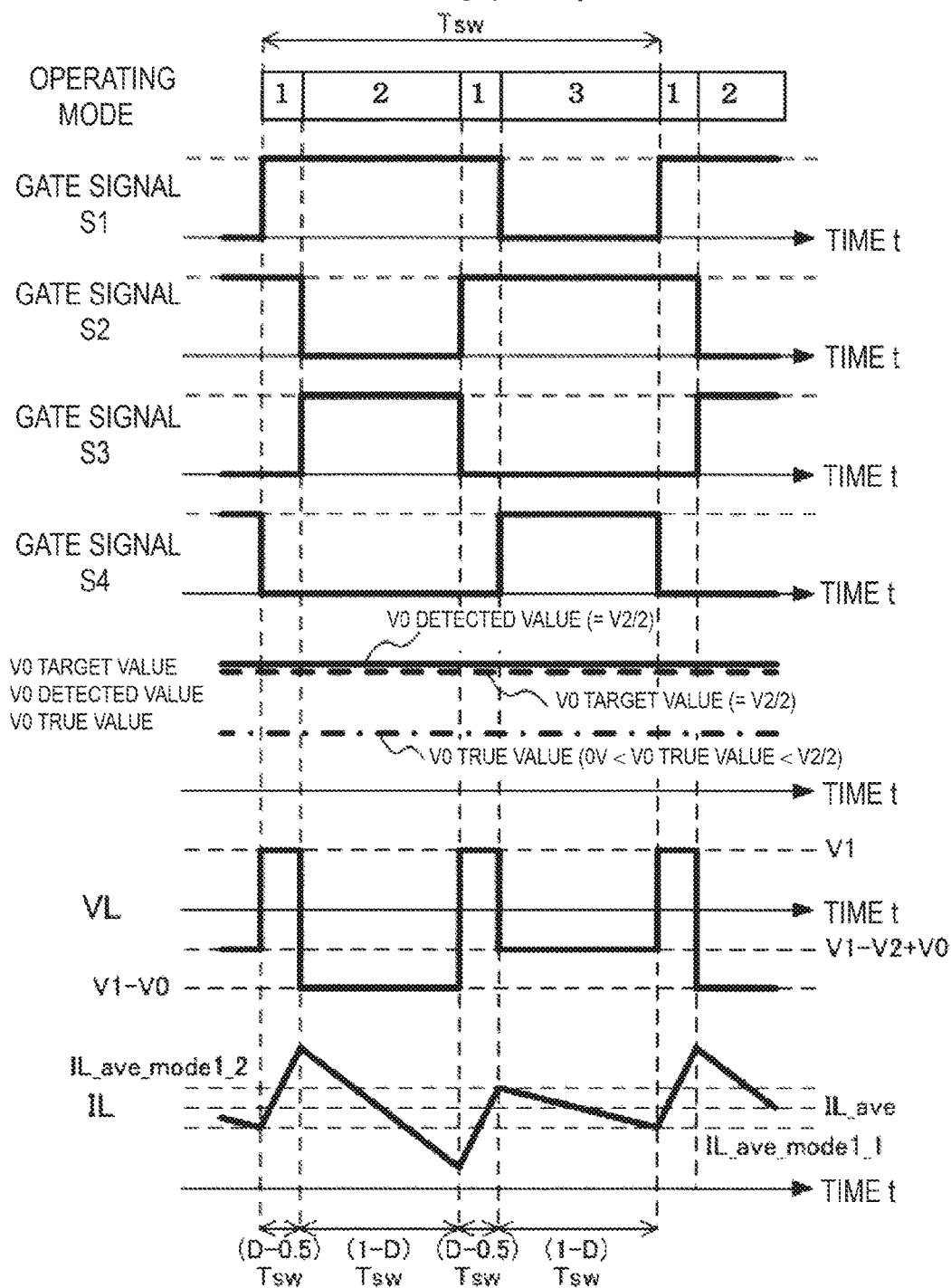
FIG. 12 is still another timing diagram of a case in which an abnormality occurs in the voltage sensor of the first embodiment of the invention.

Meanwhile, FIG. 12 is a timing diagram of a case in which output voltage V2/2<V0 true value<output voltage V2 as a result of a gain error or an offset error occurring. In this case, when comparing with FIG. 11, VL and IL in the second operating mode and VL and IL in the third operating mode are interchanged, and a magnitude relationship between ΔIL_mode2 and ΔIL_mode3, and between IL_ave_mode1_1 and IL_ave_mode1_2, is interchanged.

Figure 13:
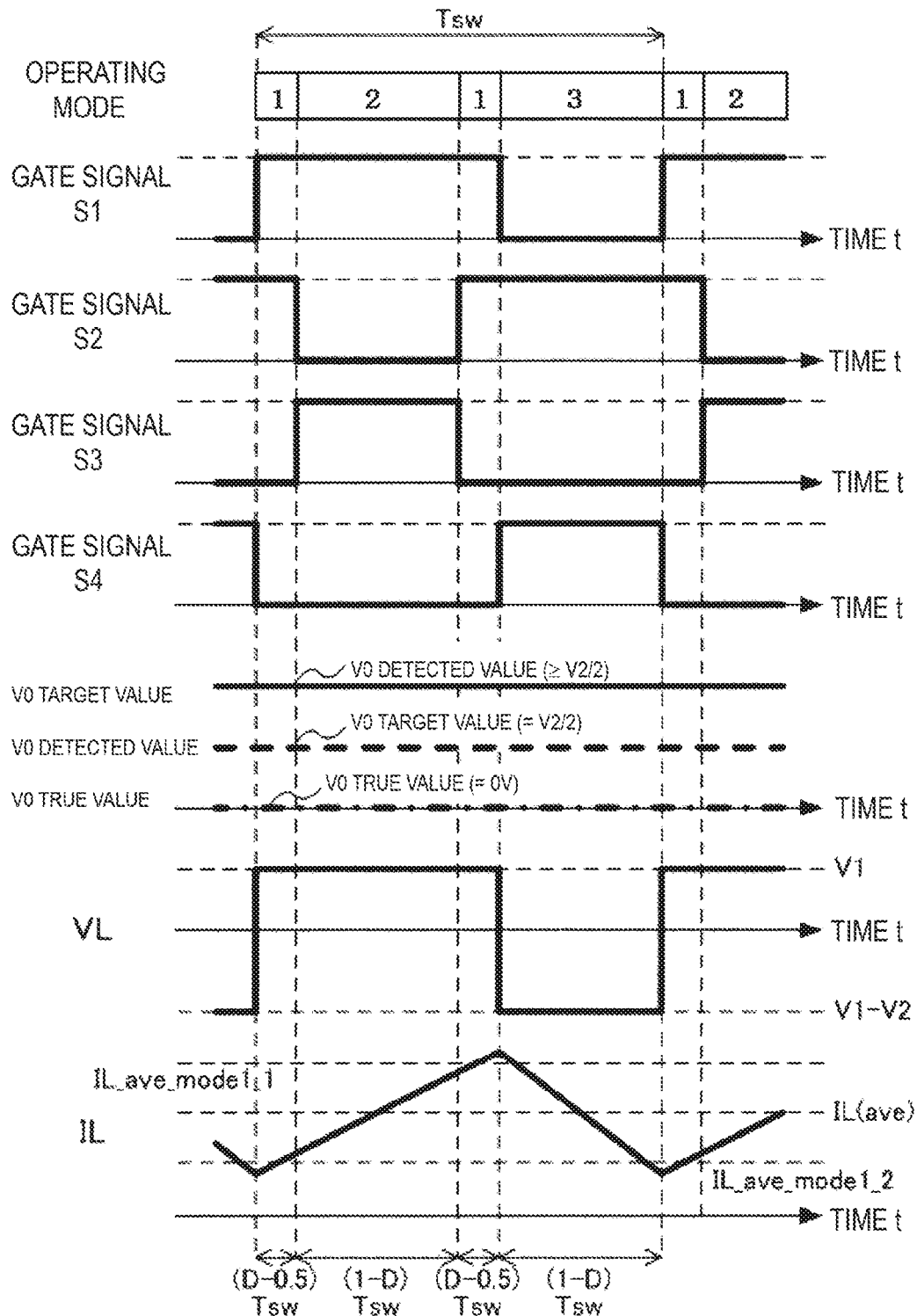
FIG. 13 is still another timing diagram of a case in which an abnormality occurs in the voltage sensor of the first embodiment of the invention.
Figure 14:
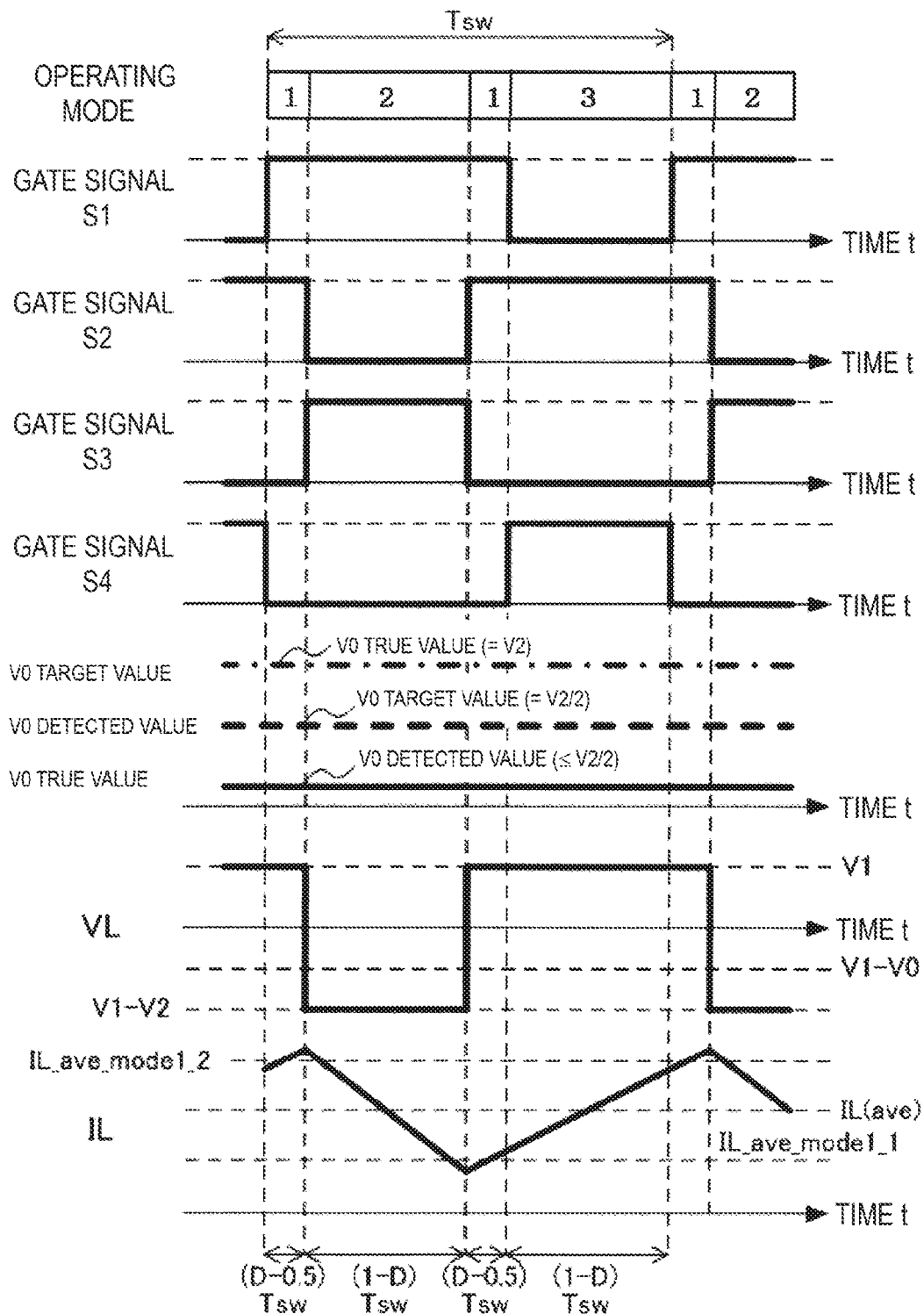
FIG. 14 is still another timing diagram of a case in which an abnormality occurs in the voltage sensor of the first embodiment of the invention.

FIG. 13 and FIG. 14 are still other timing diagrams of cases in which an abnormality occurs in the voltage sensor of the first embodiment of the invention. Herein, FIG. 13 and FIG. 14 show cases in which the step-up ratio N is 2 times or greater, and the state is a powering state. FIG. 13 is a timing diagram of a case in which the V0 true value becomes 0V as a result of a gain error, an offset error, or a sticking error occurring.

In this case, input voltage V1 (positive) is applied across the reactor 1 in three sections from the first operating mode through the second operating mode to the first operating mode, and input voltage V1−output voltage V2 (negative) is applied in the third operating mode. Consequently, the IL cycle is the same as the switching cycle Tsw of each of the semiconductor switching circuits 2a to 2d. In the same way as in FIG. 11, ΔIL_mode2 and ΔIL_mode3 are of different values to ΔIL_mode1, IL_ave_mode1_1 and IL_ave_mode1_2 are of different values to IL_ave_mode2 and IL_ave_mode3 (=IL_ave), and M_mode2 is of a different value to M_mode3.

Meanwhile, FIG. 14 is a timing diagram of a case in which the V0 true value becomes equal to the output voltage V2 as a result of a gain error, an offset error, or a sticking error occurring. In this case, when comparing with FIG. 13, VL and IL in the second operating mode and VL and IL in the third operating mode are interchanged, and a magnitude relationship between ΔIL_mode2 and ΔIL_mode3, and between IL_ave_mode1_1 and IL_ave_mode1_2, is interchanged.

Figure 19:
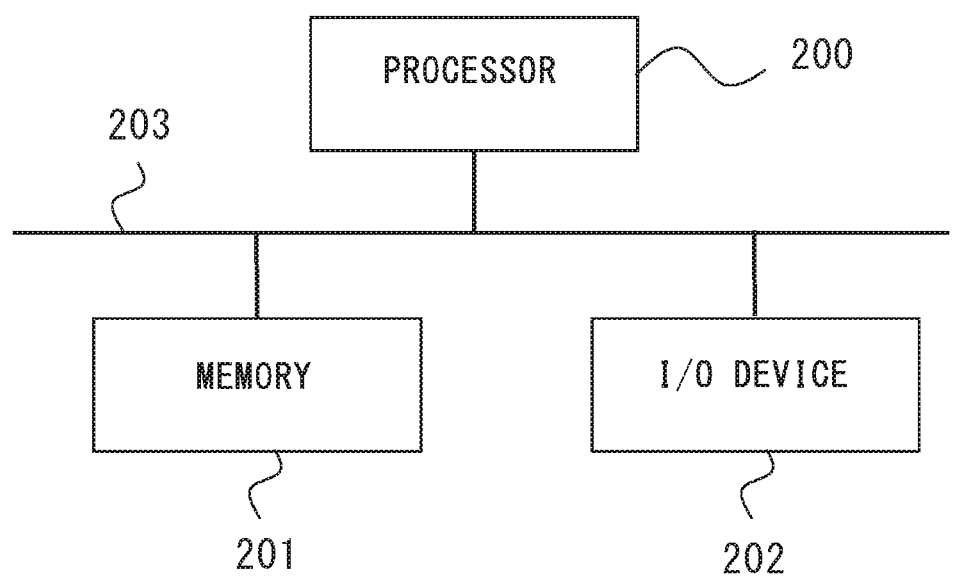
FIG. 19 is a hardware configuration diagram for realizing a block diagram according to an embodiment of an abnormality determining unit 6a of the present invention.

Each of the functional blocks shown in the embodiments is realized by the microcomputer. The hardware of the microcomputer is shown in FIG. 19. That is, a processor 200, a memory 201 for storing programs and data, and an input/output device 202 such as a sensor are connected via a data bus 203, and data processing and data transmission are performed under the control of the processor 200. The invention is such that an abnormality of the voltage sensor 7 is determined by processes shown in the following examples 1 to 4 being executed in the abnormality determining unit 6a provided in the control means 6.

Abnormality Determining Unit Example 1

Figure 15:
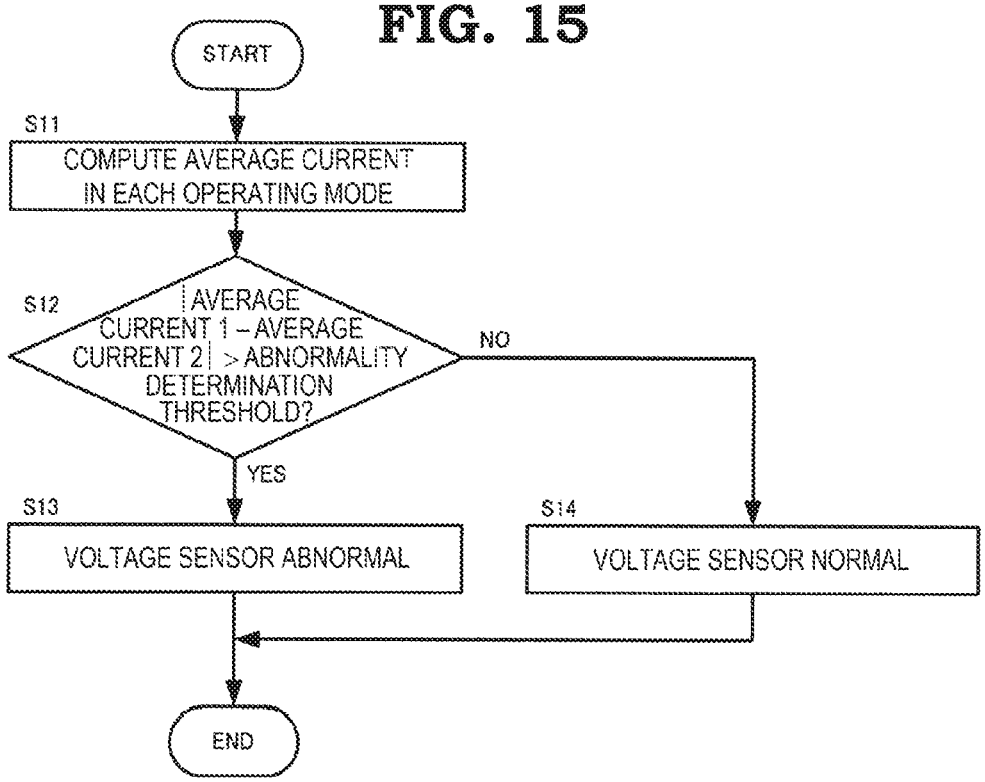
FIG. 15 is a flow diagram of an Example 1 of an abnormality determining unit used in the power conversion device shown in FIG. 1.

FIG. 15 is a flow diagram of an Example 1 of the abnormality determining unit used in the power conversion device shown in FIG. 1. Firstly, as shown in FIG. 15, an average current in each operating mode is computed in the abnormality determining unit 6a (S11). Next, the abnormality determining unit 6a determines whether the voltage sensor 7 is abnormal or normal by comparing absolute values of differences in the average currents computed in S11 with an abnormality determination threshold (S12). When an abnormality determination condition is fulfilled in S12, the abnormality determining unit 6a proceeds to S13, and determines that the voltage sensor 7 is abnormal. When the abnormality determination condition is not fulfilled in S12, the abnormality determining unit 6a proceeds to S14, and determines that the voltage sensor 7 is normal. Although the average current in each operating mode is acquired by computation by the abnormality determining unit 6a in S11, a low-pass filter or the like may be provided in the control means 6, and current values may be averaged using hardware.

Herein, specific examples of an abnormality determination condition in which the average current of each operating mode is used will be shown as follows. As previously described, the average current IL_ave_mode1 in the first operating mode or the average current IL_ave_mode4 in the fourth operating mode diverges from the average current IL_ave in all operating modes when the voltage sensor 7 is abnormal. Consequently, the abnormality determination condition (S12) is as in Equation (7). It is sufficient that an abnormality determination threshold Ith is determined by considering a tolerance of the voltage sensor 7.

[Math. 7]

$$|IL\_ave\_mode1 - IL\_ave| > Ith \text{ or } |IL\_ave\_mode4 - IL\_ave| > Ith \quad (7)$$

Also, the average current IL_ave_mode1 in the first operating mode or the average current IL_ave_mode4 in the fourth operating mode diverges from the average current IL_ave_mode2 in the second operating mode or the average current IL_ave_mode3 in the third operating mode when the voltage sensor 7 is abnormal. Consequently, the abnormality determination condition (S12) is as in Equation (8).

[Math. 8]

$$|IL\_ave\_mode1 - IL\_ave\_mode2| > Ith \text{ or }$$
$$|IL\_ave\_mode1 - IL\_ave\_mode3| > Ith \text{ or }$$
$$|IL\_ave\_mode4 - IL\_ave\_mode2| > Ith \text{ or }$$
$$|IL\_ave\_mode4 - IL\_ave\_mode3| > Ith \quad (8)$$

Also, when the voltage sensor 7 is abnormal, the average current IL_ave_mode1_1 in the first operating mode after the second operating mode diverges from the average current IL_ave_mode1_2 in the first operating mode after the third operating mode, and furthermore, the average current IL_ave_mode4_1 in the fourth operating mode after the second operating mode diverges from the average current IL_ave_mode4_2 in the fourth operating mode after the third operating mode. Consequently, the abnormality determination condition (S12) is as in Equation (9).

[Math. 9]

$$|IL\_ave\_mode1\_1 - IL\_ave\_mode1\_2| > Ith \text{ or }$$
$$|IL\_ave\_mode4\_1 - IL\_ave\_mode4\_2| > Ith \quad (9)$$

By determining that there is an abnormality in a voltage sensor that detects an intermediate capacitor voltage using a difference between an average current in a first or fourth operating mode and an average current in all operating modes, a difference between the average current in the first or fourth operating mode and an average current in a second or third operating mode, a difference between the average current in the first operating mode after the second operating mode and the average current in the first operating mode after the third operating mode, or a difference between the average current in the fourth operating mode after the second operating mode and the average current in the fourth operating mode after the third operating mode in this way, a gain error, an offset error, and a sticking error of the voltage sensor can be detected. When applying an average value as a current value used in an abnormality determination, tolerance with respect to an erroneous abnormality determination caused by noise is strengthened, because of which reliability of a determination result can be increased.

Abnormality Determining Unit Example 2

Figure 16:
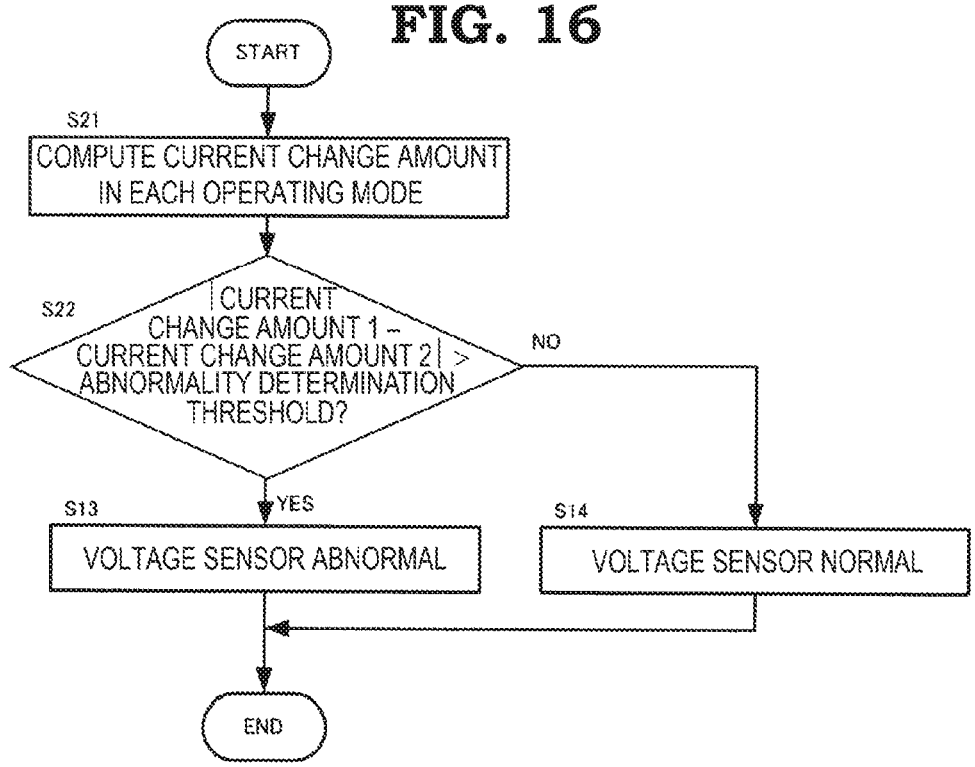
FIG. 16 is a flow diagram of an Example 2 of the abnormality determining unit used in the power conversion device shown in FIG. 1.

FIG. 16 is a flow diagram of an Example 2 of the abnormality determining unit used in the power conversion device shown in FIG. 1. Firstly, as shown in FIG. 16, a current change amount in each operating mode is computed in the abnormality determining unit 6a (S21). Next, the abnormality determining unit 6a determines whether the voltage sensor 7 is abnormal or normal by comparing absolute values of differences in the current change amounts computed in S21 with an abnormality determination threshold (S22). As a subsequent process is the same as in the previously described Example 1 of the abnormality determining unit, a description will be omitted.

Herein, specific examples of an abnormality determination condition in which the current change amount of each operating mode is used will be shown as follows. As previously described, the current change amount ΔIL_mode2 in the second operating mode or the current change amount ΔIL_mode3 in the third operating mode diverges from the current change amount ΔIL_mode1 in the first operating mode or the current change amount ΔIL_mode4 in the fourth operating mode when the voltage sensor 7 is abnormal. Consequently, the abnormality determination condition (S22) is as in Equation (10).

[Math. 10]

$$|\Delta IL\_mode2 - \Delta IL\_mode1| > Ith \text{ or } |\Delta IL\_mode2 - \Delta IL\_mode4| > Ith \text{ or } |\Delta IL\_mode3 - \Delta IL\_mode1| > Ith \text{ or } |\Delta IL\_mode3 - \Delta IL\_mode4| > Ith \quad (10)$$

Also, the current change amount ΔIL_mode2 in the second operating mode diverges from the current change amount ΔIL_mode3 in the third operating mode when the voltage sensor 7 is abnormal. Consequently, the abnormality determination condition (S22) is as in Equation (11).

[Math. 11]

$$|\Delta IL\_mode2 - \Delta IL\_mode3| > Ith \quad (11)$$

By determining that there is an abnormality in a voltage sensor that detects an intermediate capacitor voltage using a difference between a current change amount in a second or third operating mode and a current change amount in a first or fourth operating mode, and a difference between the current change amount in the second operating mode and the current change amount in the third operating mode, in this way, a gain error, an offset error, and a sticking error of the voltage sensor can be detected. When applying a current change amount as a current value used in an abnormality determination, a difference in current change amounts between operating modes is large when an abnormality occurs, because of which abnormality detectability can be increased.

Abnormality Determining Unit Example 3

Figure 17:
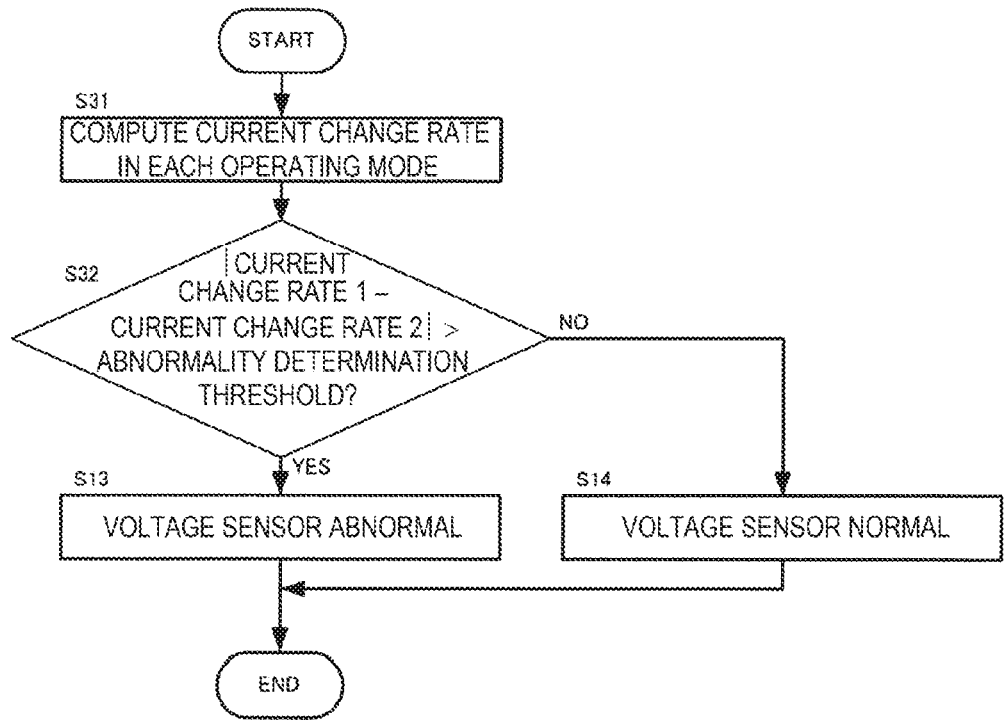
FIG. 17 is a flow diagram of an Example 3 of the abnormality determining unit used in the power conversion device shown in FIG. 1.

FIG. 17 is a flow diagram of an Example 3 of the abnormality determining unit used in the power conversion device shown in FIG. 1. Firstly, as shown in FIG. 17, a current change ratio in each operating mode is computed in the abnormality determining unit 6a (S31). Next, the abnormality determining unit 6a determines whether the voltage sensor 7 is abnormal or normal by comparing absolute values of differences in the current change ratios computed in S31 with an abnormality determination threshold (S32). As a subsequent process is the same as in Example 1 of the abnormality determining unit, a description will be omitted.

Herein, a specific example of an abnormality determination condition in which the current change ratio of each operating mode is used will be shown as follows. As previously described, the current change ratio M_mode2 in the second operating mode diverges from the current change ratio M_mode3 in the third operating mode when the voltage sensor 7 is abnormal. Consequently, the abnormality determination condition (S32) is as in Equation (12).

[Math. 12]

$$|M\_mode2 - M\_mode3| > Mth \quad (12)$$

By determining that there is an abnormality in a voltage sensor that detects an intermediate capacitor voltage using a difference between a current change ratio in a second operating mode and a current change ratio in a third operating mode in this way, a gain error, an offset error, and a sticking error of the voltage sensor can be detected. When applying a current change ratio as a current value used in an abnormality determination, a difference in current change ratios between operating modes when an abnormality occurs is large in comparison with a difference when applying a current change amount, because of which abnormality detectability can be further increased.

Abnormality Determining Unit Example 4

Figure 18:
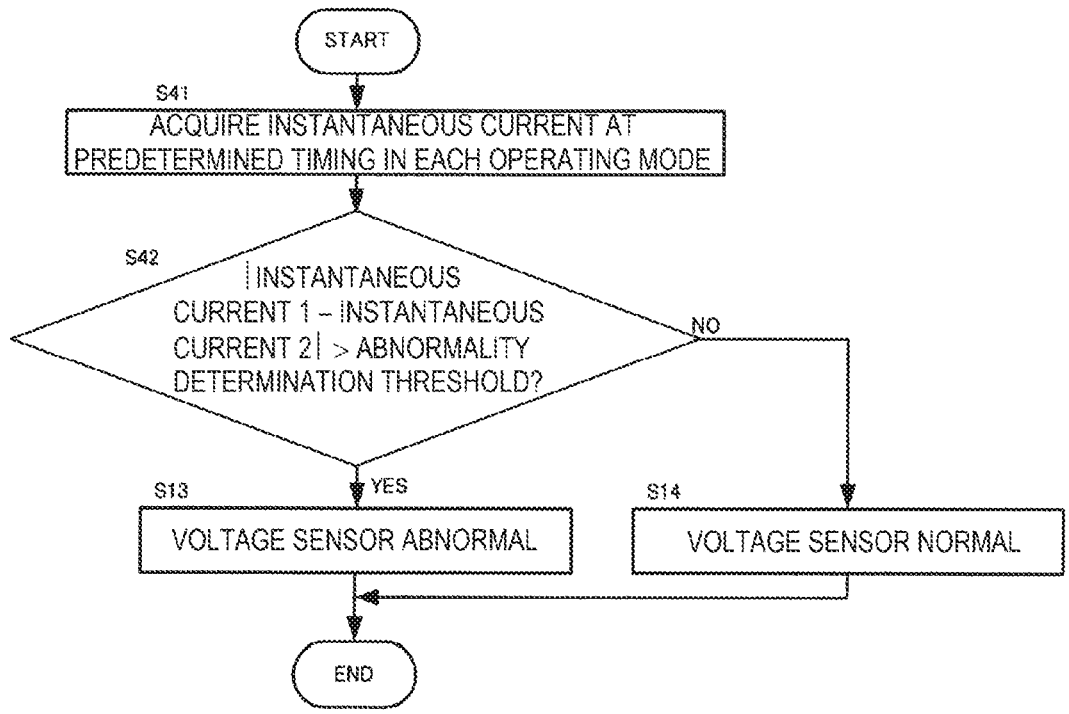
FIG. 18 is a flow diagram of an Example 4 of the abnormality determining unit used in the power conversion device shown in FIG. 1.

FIG. 18 is a flow diagram of an Example 4 of the abnormality determining unit used in the power conversion device shown in FIG. 1. Firstly, as shown in FIG. 18, an instantaneous current at a predetermined timing in each operating mode is acquired in the abnormality determining unit 6a (S41). Next, the abnormality determining unit 6a determines whether the voltage sensor 7 is abnormal or normal by comparing absolute values of differences in the instantaneous currents acquired in S41 with an abnormality determination threshold (S42). As a subsequent process is the same as in Example 1 of the abnormality determining unit, a description will be omitted.

Herein, a specific example of an abnormality determination condition in which the instantaneous current of each operating mode is used will be shown as follows. As previously described, the instantaneous current IL_mode1_1 at an intermediate timing in the first operating mode after the second operating mode diverges from the instantaneous current IL_mode1_2 at an intermediate timing in the first operating mode after the third operating mode, and furthermore, the instantaneous current IL_mode4_1 at an intermediate timing in the fourth operating mode after the second operating mode diverges from the instantaneous current IL_mode4_2 at an intermediate timing in the fourth operating mode after the third operating mode, when the voltage sensor 7 is abnormal. Consequently, the abnormality determination condition (S42) is as in Equation (13).

[Math. 13]

$$|IL\_mode1\_1 - IL\_mode1\_2| > Ith \text{ or } |IL\_mode4\_1 - IL\_mode4\_2| > Ith \quad (13)$$

By determining that there is an abnormality in a voltage sensor that detects an intermediate capacitor voltage using a difference between an instantaneous current at an intermediate timing in a first operating mode after a second operating mode and an instantaneous current at an intermediate timing in the first operating mode after a third operating mode, or a difference between an instantaneous current at an intermediate timing in a fourth operating mode after the second operating mode and an instantaneous current at an intermediate timing in the fourth operating mode after the third operating mode, a gain error, an offset error, and a sticking error of the voltage sensor can be detected. When applying an instantaneous current value as a current value used in an abnormality determination, a processing load can be lightened.

Herein, the timing at which an instantaneous current is acquired is assumed to be an intermediate (50%) timing in each operating mode, but an arbitrary timing between κ and 100% may be adopted. As the previously mentioned difference occurs in this kind of case too, a voltage sensor failure can be detected.

Also, in the previously described embodiment, an abnormality counter may be provided inside the control means 6, wherein a count of the abnormality counter is increased when an abnormality determination condition is fulfilled, and it is determined that the voltage sensor 7 is abnormal when a count value of the abnormality counter exceeds a threshold. By so doing, an instantaneous abnormality determination is eliminated, and a reliable abnormality determination can be carried out.

Furthermore, an example wherein each of the first to fourth semiconductor switching circuits 2a to 2d is configured of an IGBT and a diode has been described in the embodiment, but a MOSFET, a JFET, or the like may be adopted instead of an IGBT. When using a MOSFET, a body diode of the MOSFET may be utilized instead of a diode. Also, each of the first to fourth semiconductor switching circuits 2a to 2d may be formed of a wide bandgap semiconductor whose bandgap is large in comparison with silicon, for example, silicon carbide (SiC), a gallium nitride based material, or a diamond.

Heretofore, an embodiment of the invention has been described, but the invention not being limited to the embodiment and the previously described Examples 1 to 4, various design changes can be carried out, and embodiments can be freely combined, and each embodiment can be modified or abbreviated as appropriate, without departing from the scope of the invention.

The invention claimed is:

1. A power conversion device, comprising:
a switching circuit;
a capacitor that carries out a charging and discharging operation in accordance with a switching of the switching circuit; and
a voltage sensor that detects a voltage across the capacitor, wherein
a current sensor that detects a current supplied to a circuit including the capacitor, and an abnormality determinator that determines that there is an abnormality of the voltage sensor based on a value of current detected by the current sensor and a charging and discharging operation of the capacitor, are provided.

2. A power conversion device comprising:
a low voltage side capacitor that holds a low voltage side voltage;
a high voltage side capacitor of which a negative electrode is connected to a negative electrode of the low voltage side capacitor and which holds a high voltage side voltage;
a first semiconductor switching circuit of which one end is connected to the negative electrode of the low voltage side capacitor;
a second semiconductor switching circuit of which one end is connected to another end of the first semiconductor switching circuit and another end is connected via a reactor to a positive electrode of the low voltage side capacitor;
a third semiconductor switching circuit of which one end is connected to the other end of the second semiconductor switching circuit;
a fourth semiconductor switching circuit of which one end is connected to another end of the third semiconductor switching circuit and another end is connected to a positive electrode of the high voltage side capacitor;
an intermediate capacitor having one end is connected to a connection point of the first semiconductor switching circuit and the second semiconductor switching circuit and another end is connected to a connection point of the third semiconductor switching circuit and the fourth semiconductor switching circuit;
a voltage sensor detecting a voltage of the intermediate capacitor;
a controller that, by controlling the first semiconductor switching circuit, the second semiconductor switching circuit, the third semiconductor switching circuit, and the fourth semiconductor switching circuit, controls time ratios of four operating modes, those being a first operating mode in which current flows through the low voltage side capacitor, the reactor, the second semiconductor switching circuit, and the first semiconductor switching circuit, a second operating mode in which current flows through the low voltage side capacitor, the reactor, the third semiconductor switching circuit, the intermediate capacitor, and the first semiconductor switching circuit, a third operating mode in which current flows through the low voltage side capacitor, the reactor, the second semiconductor switching circuit, the intermediate capacitor, and the fourth semiconductor switching circuit, and a fourth operating mode in which current flows through the low voltage side capacitor, the reactor, the third semiconductor switching circuit, and the fourth semiconductor switching circuit, thereby controlling the voltage of the intermediate capacitor to a predetermined value, and further comprising:
a current sensor that detects a current flowing through the reactor; and
an abnormality determinator that determines that there is an abnormality of the voltage sensor using a current value calculated based on a value detected by the current sensor.

3. The power conversion device according to claim 2, wherein the current value is an average value of current in the first operating mode or the fourth operating mode.

4. The power conversion device according to claim 3, wherein the abnormality determinator determines that the voltage sensor is abnormal when the average value of current in the first operating mode or the fourth operating mode diverges from an average value of current in all operating modes.

5. The power conversion device according to claim 3, wherein the abnormality determinator determines that the voltage sensor is abnormal when the average value of current in the first operating mode or the fourth operating mode diverges from an average value of current in the second operating mode or the third operating mode.

6. The power conversion device according to claim 3, wherein the current value is the average value of current in the first operating mode or the fourth operating mode, and it is determined that the voltage sensor is abnormal when an average value of current in the second operating mode after the second operating mode diverges from an average value of current in the third operating mode after the third operating mode.

7. The power conversion device according to claim 2, wherein the current value is a current change amount in the second operating mode or the third operating mode.

8. The power conversion device according to claim 7, wherein it is determined that the voltage sensor is abnormal when the current change amount in the second operating mode or the third operating mode diverges from a current change amount in the first operating mode or the fourth operating mode.

9. The power conversion device according to claim 7, wherein it is determined that the voltage sensor is abnormal when the current change amount in the second operating mode diverges from the current change amount in the third operating mode.

10. The power conversion device according to claim 2, wherein it is determined that the voltage sensor is abnormal when a current change rate in the second operating mode diverges from a current change rate in the third operating mode.

11. The power conversion device according to claim 2, wherein the current value is an instantaneous current value at a predetermined timing in the first operating mode or the fourth operating mode, and it is determined that the voltage sensor is abnormal when an instantaneous current value in the second operating mode after the second operating mode diverges from an instantaneous current value in the third operating mode after the third operating mode.

12. The power conversion device according to claim 11, wherein the predetermined timing is an intermediate timing in the first operating mode or the fourth operating mode.

* * * * *